(12) United States Patent
Moriwaki et al.

(10) Patent No.: US 7,844,874 B2
(45) Date of Patent: Nov. 30, 2010

(54) SEMICONDUCTOR INTEGRATED CIRCUIT DEVICE AND INSPECTION METHOD THEREFOR

(75) Inventors: Nobuyuki Moriwaki, Kyoto (JP); Takehiro Hirai, Shiga (JP)

(73) Assignee: Panasonic Corporation, Osaka (JP)

( * ) Notice: Subject to any disclaimer, the term of this patent is extended or adjusted under 35 U.S.C. 154(b) by 965 days.

(21) Appl. No.: 11/704,370

(22) Filed: Feb. 9, 2007

(65) Prior Publication Data

US 2007/0234168 A1 Oct. 4, 2007

(30) Foreign Application Priority Data

Feb. 9, 2006 (JP) .............................. 2006-032299

(51) Int. Cl.
*G06F 11/00* (2006.01)
(52) U.S. Cl. ...................................... 714/742; 324/765
(58) Field of Classification Search ................. 324/771, 324/613, 765; 714/718, 721, 742
See application file for complete search history.

(56) References Cited

U.S. PATENT DOCUMENTS 6,429,677 B1 * 8/2002 Montrose .................... 324/765
6,559,673 B2 * 5/2003 Neeb .......................... 324/771
7,116,114 B2 * 10/2006 Kajita ......................... 324/613
7,446,553 B2 * 11/2008 Cano et al. .................. 324/765

FOREIGN PATENT DOCUMENTS

JP 2003-7785 A 1/2003

* cited by examiner

*Primary Examiner*—David Ton
(74) *Attorney, Agent, or Firm*—McDermott Will & Emery LLP

(57) ABSTRACT

A semiconductor integrated circuit device includes: a plurality of devices under test formed on a substrate; a selection circuit formed on the substrate which selects two of the plurality of devices under test; a magnitude comparison circuit formed on the substrate which measures an electrical characteristic of the two selected devices under test and makes a magnitude comparison between values of the measured electrical characteristic; an address memory circuit formed on the substrate which stores addresses of the two devices under test between which the magnitude comparison has been made; and a control circuit formed on the substrate and connected to the selection circuit, the magnitude comparison circuit, and the address memory circuit.

31 Claims, 17 Drawing Sheets

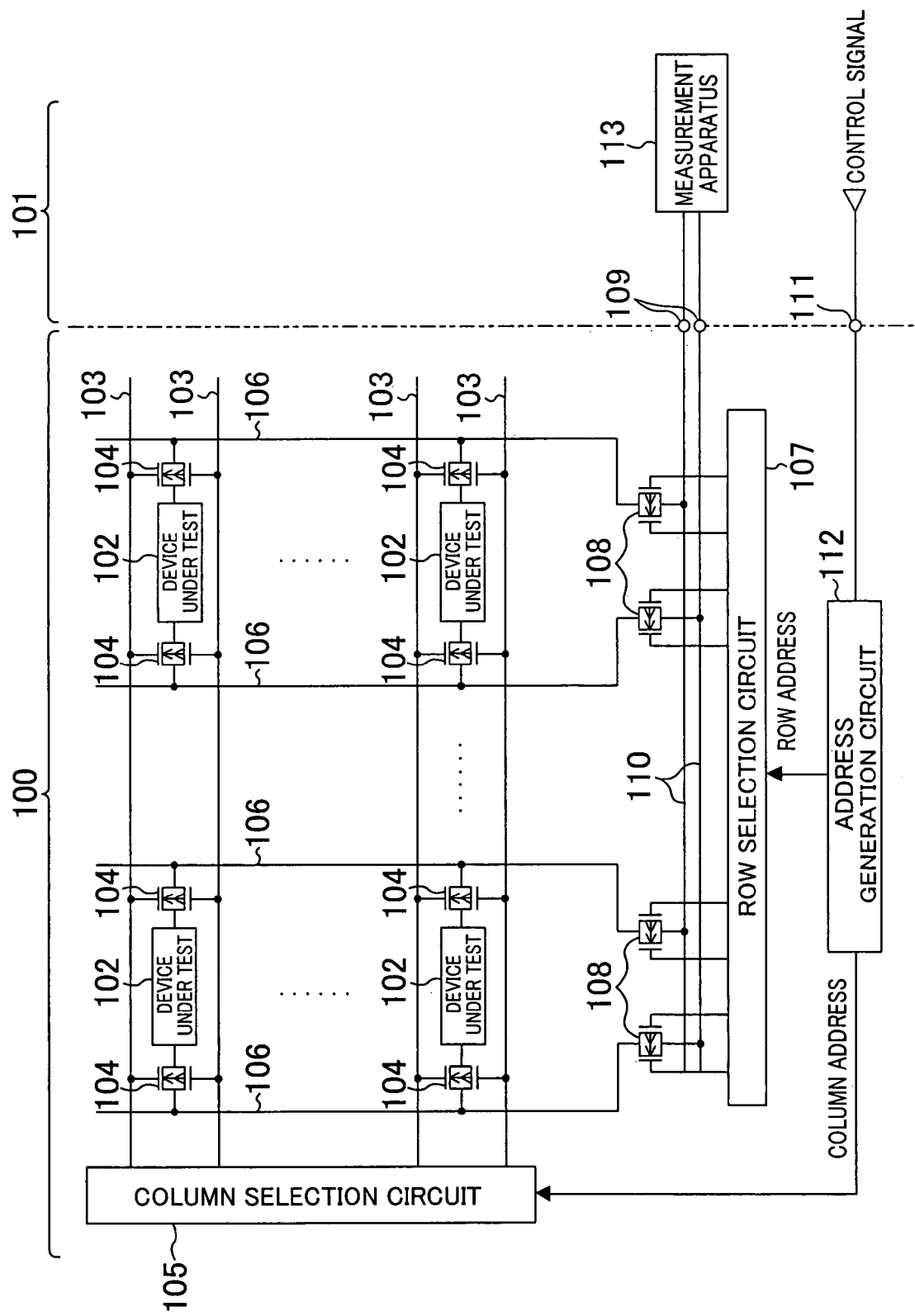

SEMICONDUCTOR INTEGRATED CIRCUIT DEVICE AND INSPECTION METHOD THEREFOR

CROSS-REFERENCE TO RELATED APPLICATION(S)

This application claims priority under 35 U.S.C. §119(a) on Japanese Patent Application No. 2006-32299 filed on Feb. 9, 2006, the entire contents disclosed in claims, specification, and drawings of which are hereby incorporated by reference.

BACKGROUND OF THE INVENTION

1. Field of the Invention

The present invention relates to a semiconductor integrated circuit device and an inspection method therefor. Specifically, the present invention relates to an inspection circuit for controlling fabrication steps of a semiconductor integrated circuit device, to a semiconductor integrated circuit device for evaluating and controlling fabrication processes and for analyzing a failure using the inspection circuit, and to an inspection method therefor.

2. Description of the Prior Art

In order to control the conditions of a fabrication line and to analyze causes of deterioration in characteristic of a semiconductor device in a fabrication process for fabricating a semiconductor integrated circuit on a semiconductor wafer, a test circuit including test elements is fabricated on the semiconductor wafer, the test circuit being used to easily and conveniently measure a characteristic of each element constituting a desired semiconductor integrated circuit. Each test element in the test circuit is measured during the fabrication process or at the end of the fabrication process to determine whether or not each test element complies with a predetermined function requirement, and the determined result is used to verify whether or not the fabrication process normally proceeds. If abnormality in characteristic is found in the test element, a more detailed evaluation is performed to identify causes of the abnormality.

In many cases, the test circuit is generally formed in a cutoff region of a semiconductor wafer. Along the cutoff region, semiconductor integrated circuits are cut from the wafer into semiconductor chips, and the cutoff region is referred to as a scribe line. Under such a condition that the scribe line is wide enough for a semiconductor wafer to be easily cut into semiconductor chips, it is desirable to minimize the line width of the scribe line in order to obtain as many semiconductor chips as possible from one semiconductor wafer. Therefore, a region provided for the test circuit is limited in area.

Meanwhile, along with the advancement of miniaturization and an increase in performance and an increase in integration in semiconductor process in recent years, requirements become more and more severe for variation in characteristics (electrical characteristics) of a semiconductor device formed on a semiconductor wafer, which makes it necessary to suppress the variation in characteristics as small as possible. In order to suppress the variation, it is necessary to measure a number of elements, for example, more than or equal to 1000 elements of the same type to check the standard deviation thereof. However, as described above, the number of measurements is limited in such a test circuit that is simply and conveniently structured to be formed in the scribe line region. Since number of pads which are connected to an external measurement apparatus used for measurement is also limited, it is difficult to measure a number of test circuits.

To cope with this problem, a measurement method is proposed in which test circuits using the limited number of pads are fabricated as many as possible in a limited area (see, for example, Japanese Laid-Open Patent Publication No. 2003-7785, which is hereinafter referred to as patent document).

A formation method of the test circuit disclosed in the patent document will be described below with reference to FIG. 17. As shown in FIG. 17, the test circuit includes: devices under test 102 arranged in rows and columns in a scribe region 100 of a semiconductor wafer; a column selection circuit 105 for selecting the devices under test 102 arranged in columns via column selection lines 103 and selection switches 104; a row selection circuit 107 for selecting the devices under test 102 arranged in rows via row selection lines 106 and the selection switches 104; common bus lines 110 connected to outside 101 of the semiconductor wafer via external measurement terminals 109 of the semiconductor wafer; and an address generation circuit 112 which is connected to an external control terminal 111 for receiving an external control signal and which generates an address for selecting one of the devices under test 102. Specifically, the address generation circuit 112 includes a shift register circuit and counts up an address signal by one address at a time up to the number of the devices under test 102 from the initial value according to a clock signal (not shown) from the outside. The common bus lines 110 are respectively connected to the row selection lines 106 via switch circuits 108. Each bus line 110 is connected to a measurement apparatus 113 in the outside 101 via each external measurement terminal 109.

Therefore, in the test circuit shown in FIG. 17, when an address control signal is input from the outside, the selected devices under test 102 are successively connected to the external measurement terminals 109. As a result, an electrical characteristic of each device under test 102 can be successively measured by the measurement apparatus 113. In this conventional example, the address generation circuit 112, the column selection circuit 105, and the row selection circuit 107 are provided to make it possible to successively measure a plural number of devices under test 102 with relatively few external control terminals 111 and signals.

However, an inspection method for the conventional semiconductor integrated circuit device adopts an electrical measurement in which a predetermined set-up voltage is applied to a device under test and a current flowing through the device under test is measured to evaluate a quality of the fabrication process.

In order to realize a high accuracy measurement, the measurement apparatus 113 performing the electrical measurement as illustrated with reference to FIG. 17 requires a waiting period, generally about several tens of milliseconds to several hundreds of milliseconds, per measurement of a device. The waiting period is a period after a predetermined applied voltage is set until the applied voltage stabilizes.

The test circuit disclosed in the patent document requires several tens of milliseconds to several hundreds of milliseconds after an address of a device under test 102 is advanced by one by the external control signal and the device under test 102 is measured until a measurement of a device under test 102 in a next address is initiated. Therefore, if the test circuit includes, for example, 1000 devices under test, measuring all of the devices under test 102 under only one condition takes several tens of seconds to several hundreds of seconds. If a whole area of the semiconductor wafer is measured while changing measurement conditions or the like for every device under test 102, there is a problem that an enormously long inspection time is required.

In a current fabrication process of semiconductor device, cost required for inspection constitutes a large proportion of the whole fabrication cost, and it is not cost-effective to spend such a long time for the inspection.

SUMMARY OF THE INVENTION

In view of the above-mentioned conventional problems, an object of the present invention is to enable to verify quality of the fabrication process at a reasonable cost, that is, within a reasonable time.

To achieve the above-mentioned object, in the present invention, a semiconductor integrated circuit device for inspection is structured such that when an electrical characteristic of a plurality of devices under test are measured, devices having the maximum value and the minimum value, the median value, or a value greater or smaller than a reference value among the measured electrical characteristic are externally evaluated.

Specifically, a first semiconductor integrated circuit device of the present invention includes: a plurality of devices under test formed on a substrate; a selection circuit formed on the substrate which selects two of the plurality of devices under test; a magnitude comparison circuit formed on the substrate which measures an electrical characteristic of the two selected devices under test and makes a magnitude comparison between values of the measured electrical characteristic; an address memory circuit formed on the substrate which stores addresses of the two devices under test between which the magnitude comparison has been made; and a control circuit formed on the substrate and connected to the selection circuit, the magnitude comparison circuit, and the address memory circuit.

According to the first semiconductor integrated circuit device, the magnitude comparison circuit makes the magnitude comparison of the electrical characteristic between the devices under test, which makes it possible to verify quality of the fabrication process, that is, stability of the fabrication process within a reasonable time.

In the first semiconductor integrated circuit device, it is preferable that the control circuit has a first operation mode in which the control circuit performs the following processes: enabling the magnitude comparison circuit to successively measure the electrical characteristic of the two devices under test selected by the selection circuit; extracting at least one of a first device under test and a second device under test, the first device under test having the maximum value and the second device under test having the minimum value among measured values of the plurality of devices under test; and storing an address of at least one of the extracted first and second devices under test in the address memory circuit. In this case, it is possible to certainly extract a device under test which has the maximum value or the minimum value among the measured values of the plurality of devices under test.

In the first semiconductor integrated circuit device, it is preferable that the control circuit has a second operation mode in which the control circuit outputs to an external terminal the electrical characteristic of at least one of the first device under test and the second device under test extracted in the first operation mode. In this case, it is possible to evaluate only a device under test having the maximum value or the minimum value among the measured values of the electrical characteristic of the devices under test, and to estimate a variation status of all of the measured values without using a standard variation. Therefore, it is possible to verify stability of the fabrication process within a reasonable time.

In the first semiconductor integrated circuit device, it is preferable that in the first operation mode, the control circuit performs at least one of the following processes: extracting a predetermined number of devices under test in descending order of the measured values such that the extracted devices include the first device under test; and extracting a predetermined number of devices under test in ascending order of the measured values such that the extracted devices include the second device under test, and in the second operation mode, the control circuit outputs to the external terminal the electrical characteristic of at least one group of the predetermined number of devices under test extracted in descending order of the measured values which includes the first device under test and the predetermined number of devices under test extracted in ascending order of the measured values which includes the second device under test. As in this case, extracting measured values in descending order such that the extracted measured values include the maximum value and measured values in ascending order such that the extracted measured values include the minimum value makes it possible to determine whether or not the maximum value and the minimum value are abnormal values.

In this case, it is preferable that in the first operation mode, the control circuit excludes from the plurality of devices under test such devices under test that are determined to be the predetermined number of devices under test extracted from the measured devices under test in descending order of the measured values which includes the first device under test, or the predetermined number of devices under test extracted from the measured devices under test in ascending order of the measured values which includes the second device under test. In this case, an unnecessary determination process and an address data replacement process can be eliminated because once the predetermined number of devices under test are extracted in descending order of the measured values such that the extracted devices include the device having the maximum value, the order of the predetermined number of devices under test which is determined in terms of magnitude does not change even if the predetermined number of devices under test are compared with the other devices under test. Therefore, it is possible to perform the magnitude comparison process within a shorter time.

In a first semiconductor integrated circuit device, it is preferable that the magnitude comparison circuit includes a current mirror circuit whose sources are respectively connected to the two of the plurality of devices under test, and a difference in current drivability between the two devices under test is output to the current mirror circuit.

In a first semiconductor integrated circuit device, it is preferable that the magnitude comparison circuit includes a sense amplifier circuit formed on the substrate with which a difference in time required for discharging an electric charge charged in stray capacitances of bus lines is detected as a potential difference, the bus lines connecting the magnitude comparison circuit with the plurality of devices under test and the discharging being caused by a current flowing through the selected devices under test.

It is preferable that the first semiconductor integrated circuit device further includes an address output circuit to which an address of any of the plurality of devises under test is externally input to specify an address and which outputs to the external terminal the electrical characteristic of a device under test corresponding to the specified address.

A second semiconductor integrated circuit device of the present invention includes: a plurality of devices under test formed on a substrate; a selection circuit formed on the substrate which selects two of the plurality of devices under test;

a magnitude comparison circuit formed on the substrate which measures an electrical characteristic of the two selected devices under test and makes a magnitude comparison between values of the measured electrical characteristic; an address memory circuit formed on the substrate which stores addresses of the two devices under test between which the magnitude comparison has been made; a counter circuit formed on the substrate which counts one of the two devices under test and holds the counted number, the magnitude comparison having been made between the two devices under test; a control circuit formed on the substrate and connected to the selection circuit, the magnitude comparison circuit, and the address memory circuit.

According to the second semiconductor integrated circuit device, the magnitude comparison circuit and the counter circuit are provided, which makes it possible to count one of the two devices under test between which the magnitude comparison has been made. Therefore, it possible to verify quality of the fabrication process, that is, stability of the fabrication process within a reasonable time.

In the second semiconductor integrated circuit, it is preferable that the control circuit has a first operation mode in which the control circuit enables the magnitude comparison circuit to measure the electrical characteristic of a device under test first selected by the selection circuit and one of the other devices under test excepting the first selected device under test, the number of devices under test having greater or smaller values of the electrical characteristic than the first selected device under test is held in the counter circuit, and the magnitude comparison is repeated while successively updating the first selected device under test until the number held in the counter circuit reaches about one half of the number of the plurality of devices under test at completion of the magnitude comparison performed on all the plurality of devices under test such that a device under test having a median or a value close to the median among measured values of the electrical characteristic is extracted from the plurality of devices under test. In this way, it is possible to obtain an approximate median among measured values of the electrical characteristic of the plurality of devices under test in a very short time.

In the second semiconductor integrated circuit device, it is preferable that the control circuit has a second operation mode in which the control circuit outputs to an external terminal the electrical characteristic of the first or second device under test selected in the first operation mode. In this way, the second operation mode enables to check quality of the fabrication process within a short time.

In the second semiconductor integrated circuit device, it is preferable that the magnitude comparison circuit includes a current mirror circuit whose sources are respectively connected to the two of the plurality of devices under test, and a difference in current drivability between the two devices under test is output to the current mirror circuit.

In the second semiconductor integrated circuit device, it is preferable that the magnitude comparison circuit includes a sense amplifier circuit formed on the substrate with which a difference in time required for discharging an electric charge charged in stray capacitances of bus lines is detected as a potential difference, the bus lines connecting the magnitude comparison circuit with the plurality of devices under test and the discharging being caused by a current flowing through the selected devices under test.

A third semiconductor integrated circuit device of the present invention includes: a plurality of devices under test formed on a substrate; a reference power supply generation circuit formed on the substrate which generates a reference voltage; a selection circuit formed on the substrate which selects one of the plurality of devices under test; a magnitude comparison circuit formed on the substrate which measures an electrical characteristic of the selected device under test and makes a magnitude comparison between a value of the measured electrical characteristic and the reference voltage; a counter circuit formed on the substrate which enables the magnitude comparison circuit to measure the electrical characteristic of the device under test successively selected by the selection circuit from the plurality of devices under test, and counts the number of devices under test having greater or smaller values of the electrical characteristic than the reference voltage and holds the counted number; and a control circuit formed on the substrate and connected to the selection circuit, the magnitude comparison circuit, and the address memory circuit.

According to the third semiconductor integrated circuit device, the magnitude comparison circuit and the counter circuit are provided, which makes it possible to make a magnitude comparison between an electrical characteristic of each of the devices under test and the reference voltage. Therefore, it possible to verify quality of the fabrication process, that is, stability of the fabrication process within a reasonable time.

In the third semiconductor integrated circuit device, it is preferable that the control circuit has an operation mode in which the control circuit enables the magnitude comparison circuit to measure the electrical characteristic of the device under test successively selected by the selection circuit from the plurality of devices under test, the number of devices under test having greater or smaller values of the electrical characteristic than the reference voltage is held in the counter circuit, and on completion of the magnitude comparison performed on all the plurality of devices under test, the control circuit outputs to an external terminal the number of the devices under test held in the counter circuit. In this case, it is possible to obtain the number of devices under test having a greater or smaller electrical characteristic than the reference voltage among the devices under test within a very short time. Therefore, it is possible to check variation in the fabrication process within a short time.

In the third semiconductor integrated circuit device, it is preferable that the magnitude comparison circuit includes a current mirror circuit whose sources are respectively connected to the selected device under test and the reference power supply generation circuit, and a difference in current drivability between the selected device under test and the reference power supply generation circuit is output to the current mirror circuit.

In the third semiconductor integrated circuit device, it is preferable that the magnitude comparison circuit includes a sense amplifier circuit formed on the substrate with which a difference in time required for discharging an electric charge charged in stray capacitances of bus lines is detected as a potential difference, the bus lines connecting the magnitude comparison circuit with the plurality of devices under test and the discharging being caused by a current flowing through the selected device under test and the reference power supply generation circuit.

In the first through third semiconductor integrated circuit device, it is preferable that the plurality of devices under test are arranged in rows and columns, and the selection circuit is connected to column selection lines and row selection lines.

In the first through third semiconductor integrated circuit devices, it is preferable that the plurality of devices under test include devices under test which are different in plane dimensions from each other.

In the first through third semiconductor integrated circuit devices, it is preferable that the substrate is a semiconductor wafer, and at least the plurality of devices under test, the selection circuit, the address memory circuit, and the control circuit are formed in a scribe line region which is provided between chip formation regions on the semiconductor wafer.

A first inspection method for a semiconductor integrated circuit device of the present invention includes the steps of: (a) selecting two of a plurality of devices under test formed on a substrate; (b) measuring an electrical characteristic of the two selected devices under test and making a magnitude comparison between values of the measured electrical characteristic to extract the device under test having a greater measured value and the device under test having a smaller measured value; (c) performing step (a) and step (b) repeatedly until completion of the measurement of the electrical characteristic of all the plurality of devices under test and extracting a first device under test and a second device under test from the plurality of devices under test, the first device under test having the maximum value and the second device under test having the minimum value among measured values of the electrical characteristic; (d) evaluating the electrical characteristic of the first device under test and the second device under test extracted in step (c) using an external electrical characteristic evaluation apparatus.

According to the first inspection method for the semiconductor integrated circuit device, the electrical characteristic of the two selected devices under test is measured and the magnitude comparison is made between the values of the measured electrical characteristic to extract the device under test having a greater measured value and the device under test having a smaller measured value. Then, a first device under test and a second device under test are extracted from the plurality of devices under test, the first device under test having the maximum value and the second device under test having the minimum value among the measured values of the electrical characteristic. This allows the external electrical characteristic evaluation apparatus to evaluate only the device under test having the maximum value and the device under test having the minimum value among the measured values of the electrical characteristic of the plurality of devices under test. Therefore, a variation status of all measured values can be estimated without using a standard deviation. As a result, it is possible to verify quality of the fabrication process, that is, stability of the fabrication process in a reasonable time.

In the first inspection method of a semiconductor integrated circuit device, it is preferable that step (c) includes extracting a predetermined number of devices under test in descending order of the measured values such that the extracted devices include the first device under test and extracting a predetermined number of devices under test in ascending order of the measured values such that the extracted devices include the second device under test, and step (d) includes respectively evaluating the electrical characteristic of the predetermined number of devices under test extracted in descending order of the measured values which includes the first device under test and the electrical characteristic of the predetermined number of devices under test extracted in ascending order of the measured values which includes the second device under test. As in this case, extracting the measured values in descending order such that the extracted values include the maximum value and the measured values in ascending order such that the extracted values include the minimum value makes it possible to determine whether or not the maximum value and the minimum value are abnormal values.

In this case, it is preferable that step (c) includes excluding from the devices under test such devices under test that are determined to be the predetermined number of devices under test extracted from the measured devices under test in descending order of the measured values which includes the first device under test and the predetermined number of devices under test extracted from the measured devices under test in ascending order of the measured values which includes the second device under test. In this case, an unnecessary determination process and an address data replacement process can be eliminated because once the predetermined number of devices under test are extracted in descending order of the measured values such that the extracted devices include the device having the maximum value, the order of the predetermined number of devices under test which is determined in terms of magnitude does not change even if the predetermined number of devices under test is compared with the other devices under test. Therefore, it is possible to perform the magnitude comparison process in a shorter time.

A second inspection method for a semiconductor integrated circuit device of the present invention includes steps of: (a) from a plurality of devices under test formed on a substrate, first selecting a device under test and then selecting one of the other devices under test excepting the first selected device under test; (b) measuring an electrical characteristic of the two selected devices under test and making a magnitude comparison between values of the measured electrical characteristic to extract the device under test having a greater measured value or the device under test having a smaller measured value; (c) counting the extracted device under test and holding the counted number; (d) performing step (b) and step (c) on every one of the rest of the other devices under test and repeating the magnitude comparison while successively updating the first selected device under test until the counted number in step (c) reaches about one half of the number of the plurality of devices under test at completion of the magnitude comparison performed on all the plurality of devices under test such that a device under test having a median or a value close to the median among measured values of the electrical characteristic is extracted from the plurality of devices under test; and (e) evaluating the electrical characteristic of the device under test extracted in step (d) using an external electrical characteristic evaluation apparatus.

According to the second inspection method for the semiconductor integrated circuit device, a device under test having a median or a value close to the median among measured values of the electrical characteristic is extracted from the plurality of devices under test, and then, an electrical characteristic of the extracted device under test is evaluated using an external electrical characteristic evaluation apparatus. This makes it possible to obtain a median or a value close to the median among measured values of the plurality of devices under test. Therefore, it is possible to check quality of the fabrication process within a short time.

A third inspection method for a semiconductor integrated circuit device of the present invention includes: (a) selecting one of a plurality of devices under test formed on a substrate; (b) measuring an electrical characteristic of the selected device under test and making a magnitude comparison between a value of the measured electrical characteristic and a reference voltage to extract the device under test having a greater or smaller value of electrical characteristic than the reference voltage; (c) counting the extracted device under test and holding the counted number; and (d) performing step (b) and step (c) on every one of the rest of the other devices under test and outputting the counted number in step (c) to the outside at the time of completion of the magnitude comparison of all the plurality of devices under test.

According to the third inspection method for a semiconductor integrated circuit device, an electrical characteristic of the selected device under test is measured and a value of the measured electrical characteristic is compared with a reference voltage to extract a device under test whose values of electrical characteristic is greater or smaller than the reference voltage, and the extracted device under test is counted and the counted number is held in the counter circuit. These steps are performed on every one of the rest of the other devices under test, and at the time of completion of magnitude comparison on all the plurality of devices under test, the counted number is output to the outside. This makes it possible to obtain the number of devices under test whose electrical characteristic is greater or smaller than the reference voltage among the devices under test in a very short time. Therefore, it is possible to check a variation status in the fabrication process within a short time.

As described above, the semiconductor integrated circuit device and the inspection method therefore according to the present invention allow verifying the fabrication process within a short time, which makes it possible to find a decrease in yield at an early stage, the decrease being caused by variation in fabrication process.

BRIEF DESCRIPTION OF THE DRAWINGS

FIG. 6A and FIG. 6B illustrate a device under test in the semiconductor integrated circuit device of Embodiment 1 of the present invention, wherein FIG. 6A is a circuit diagram illustrating a transistor, and FIG. 6B is a cross section illustrating a contact chain.

FIG. 15A and FIG. 15B illustrate a device under test in a semiconductor integrated circuit device of Embodiments 1 through 5 of the present invention, wherein FIG. 15A is a plan view illustrating a transistor, and FIG. 15B is a plan view illustrating a contact chain.

FIG. 16A and FIG. 16B illustrate a device under test in a semiconductor integrated circuit device of Embodiment 6 of the present invention, wherein FIG. 16A is a plan view illustrating a transistor, and FIG. 16B is a plan view illustrating a contact chain.

FIG. 17 is a block diagram schematically illustrating a conventional semiconductor integrated circuit device.

DESCRIPTION OF THE PREFERRED EMBODIMENTS

Embodiment 1

Embodiment 1 of the present invention will be described with reference to the drawings.

Figure 1:
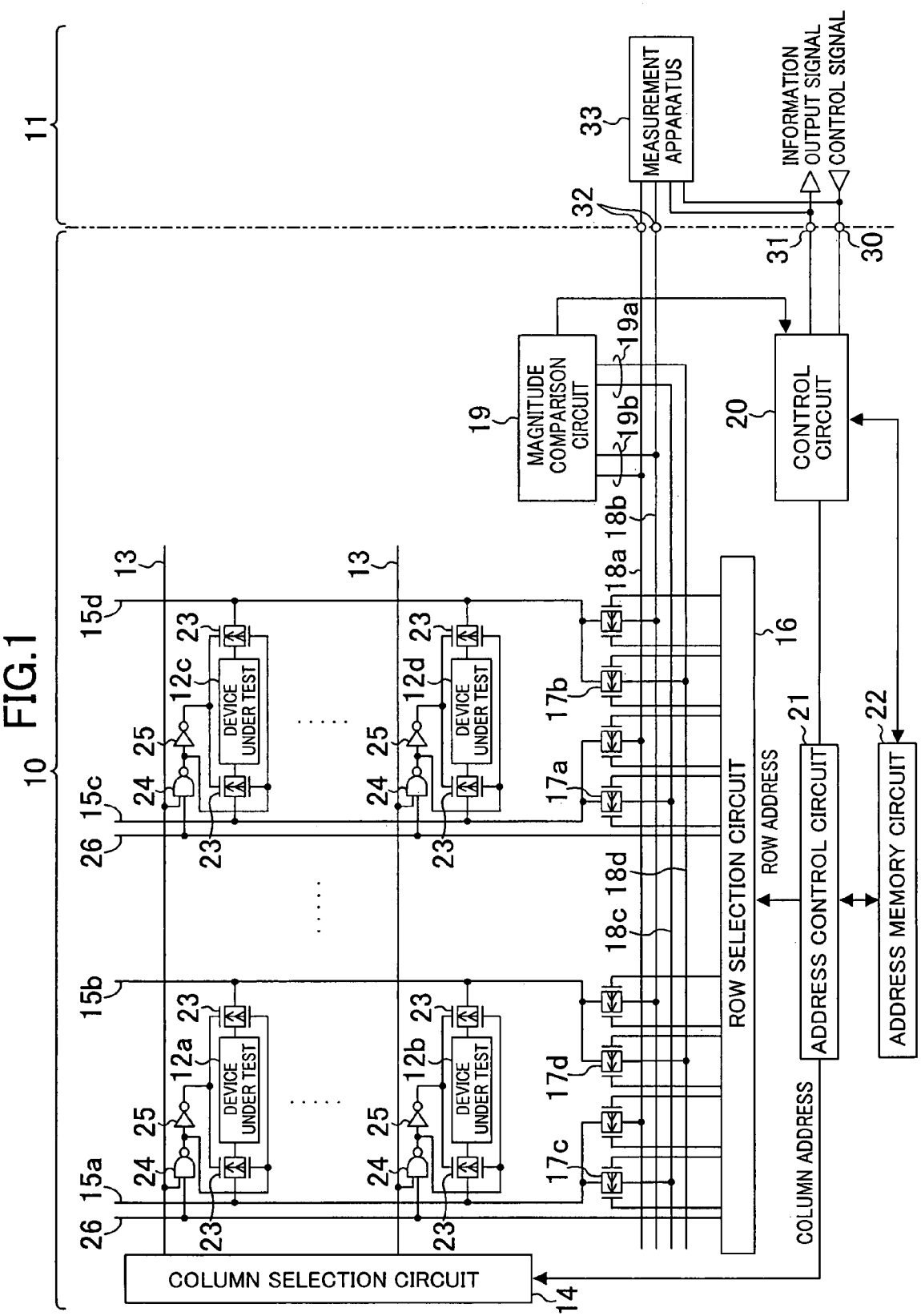
FIG. 1 is a block diagram schematically illustrating a semiconductor integrated circuit device of Embodiment 1 of the present invention.

FIG. 1 is a block diagram illustrating a semiconductor inspection circuit device, which is a semiconductor integrated circuit device of Embodiment 1 of the present invention.

As shown in FIG. 1, the semiconductor inspection circuit device of Embodiment 1 includes: a plurality of devices under test, such as devices under test 12a, 12b, 12c, and 12d, which are formed, for example, in a scribe line region of a semiconductor wafer 10 and which are arranged in rows and columns; a column selection circuit 14 which is connected to each of the devices under test 12a, 12b, 12c, and 12d via column selection lines 13; a row selection circuit 16 which is connected to each of the devices under test 12a, 12b, 12c, and 12d via row selection lines, such as row selection lines 15a, 15b, 15c, and 15d; a magnitude comparison circuit 19 which is connected to each of the row selection lines 15a, 15b, 15c, and 15d respectively via switches 17a, 17b, 17c, and 17d and via bus lines 18a, 18b, 18c, and 18d; a control circuit 20 which receives a signal from the magnitude comparison circuit 19 and a signal via a first control terminal 30 to control an address of each of the devices under test 12a, 12b, 12c, and 12d; an address control circuit 21 which receives a signal form the control circuit 20; and an address memory circuit 22 which holds an address from the address control circuit 21.

The address control circuit 21 outputs a specified column address and a specified row address respectively to the column selection circuit 14 and the row selection circuit 16. The column address and the row address respectively received by the column selection circuit 14 and the row selection circuit 16 are decoded and output to the column selection line 13 and the row selection line, for example, row selection line 15a.

Each devices under test, for example, device under test 12a is connected to the column selection line 13 and the row selection lines, for example, row selection lines 15a and 15b via selection switches 23 each of which is formed of a parallel connection of an n-type FET (field effect transistor) and a p-type FET. Between each selection switch 23 and the column selection line 13, a NAND circuit 24 and an inverter circuit 25 are serially connected with each other. An output signal of the NAND circuit 24 is applied to the gate of the p-type FET of each selection switch 23, and an output signal of the inverter circuit 25 is applied to the gate of the n-type FET of each selection switch 23. An input terminal of the NAND circuit 24' is connected to a column selection enable line 26. The source or the drain shared by the n-type FET and the p-type FET of each selection switch 23 is connected to the row selection line, for example, row selection line 15a or 15b.

The semiconductor inspection circuit device of Embodiment 1 has a self-contained operation mode as a first operation mode and a manual measurement mode as a second operation mode which are operation modes of the semiconductor inspection circuit device. In the self-contained operation mode, an electrical characteristic of all devices under test, such as devices under test 12a, 12b, 12c, and 12d is successively measured to obtain the maximum value and the minimum value among measured values. In the manual measurement mode, the electrical characteristic of a device under test, for example, device under test 12a specified by a control signal from the outside is measured.

That is, in the self-contained operation mode, upon receiving the control signal via the first control terminal 30, the control circuit 20 enables the magnitude comparison circuit 19 in the semiconductor inspection circuit device to make a magnitude comparison between measured values of all the devices under test 12a, 12b, 12c, and 12d in a self contained manner, and addresses in which the maximum value and the minimum value are obtained by the magnitude comparison are held in the address memory circuit 22. When the comparison process is completed, a flag signal or the like notifying the completion is output to the outside 11 via the second control terminal 31.

In the manual measurement mode, according to another control signal and address information input via the first control terminal 30, a specified address is set in the column selection circuit 14 and the row selection circuit 16, and the measurement apparatus 33 provided in the outside 11 measures the electrical characteristic of a devices under test in the specified address, for example, device under test 12a via the bus lines 18a and 18b.

The self-contained operation mode is described in more detail below. Here, a method for obtaining an address of a device under test having the maximum value among measured values will be explained. In a process for obtaining an address of a device under test having the minimum value, an address having a smaller value resulting from the comparison made by the magnitude comparison circuit 19 is held in the address memory circuit 22.

In the self-contained operation mode, the control circuit 20 instructs the address control circuit 21 to successively select devices under test on a two-by-two basis from p×q devices under test, such as devices under test 12a, 12b, 12c, and 12d arranged in, for example, p rows and q columns (where p and q are integers greater than or equal to 2), and an electrical characteristic of the two selected devices under test, for example, devices under test 12a and 12d is measured. The measured values of the two selected devices under test 12a and 12d are compared with each other in the magnitude comparison circuit 19, and an address of the device under test 12a or 12d having a greater measured value is stored in the address memory circuit 22. This comparison process is performed such that all the devices under test 12a, 12b, 12c, and 12d are compared with each other.

Here, as an example, a comparison of the measured values of the device under test 12a and the device under test 12d is explained.

First, a control signal instructing the self-contained operation mode is input from the outside 11 to the control circuit 20 via the first control terminal 30. Then, the control circuit 20 controls the address control circuit 21 such that address signals for selecting the selection switches 23 connected to the device under test 12a and the selection switches 23 connected to the device under test 12d are respectively output to the column selection circuit 14 and the row selection circuit 16. The address control circuit 21 can be easily realized by known two pairs of shift register circuits.

The selection switches 23 connect the device under test 12a to the row selection lines 15a and 15b and the device under test 12d to the row selection lines 15c and 15d.

Further, the switches 17c and 17d in a first row counted from the row selection circuit 16 are selected to connect the device under test 12a with a first input terminal pair 19a of the magnitude comparison circuit 19 via the bus lines 18c and 18d. Moreover, the switches 17a and 17b in a pth row counted from the row selection circuit 16 are selected to connect the device under test 12d to a second input terminal pair 19b of the magnitude comparison circuit 19 via the bus lines 18a and 18b.

The magnitude comparison circuit 19 makes a comparison between the device under test 12a and the device under test 12d in terms of electrical characteristic, such as impedance characteristic, wherein the electrical characteristic of the device under test 12a is input to the first input terminal pair 19a and the electrical characteristic of the device under test 12d is input to the first input terminal pair 19b. Then, the magnitude comparison circuit 19 returns a flag signal to the control circuit 20, the flag signal representing the input terminal pair 19a or 19b having the greater value of electrical characteristic.

Then, the control circuit 20 stores an address of the device under test having a greater measured value in the address memory circuit 22.

Next, the other address which is not stored is advanced by one address and a next comparison process is performed. A series of the comparison processes are successively repeated to compare all of the devices under test with each other, so that an address of the device under test having the maximum value among the measured values is held in the address memory circuit 22.

Figure 2:
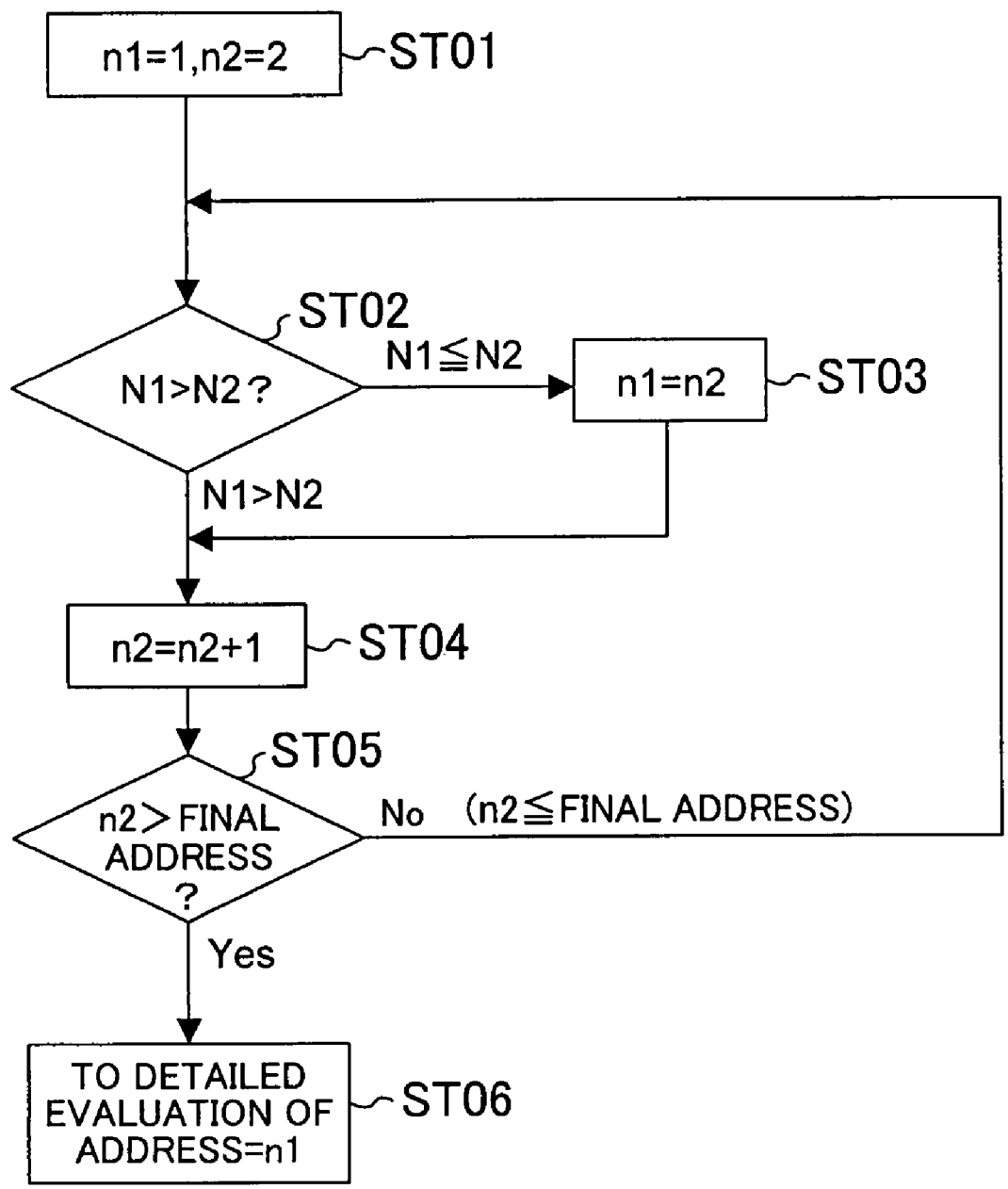
FIG. 2 is a flow chart illustrating comparison processes in a magnitude comparison circuit of Embodiment 1 of the present invention.

FIG. 2 shows an exemplary flow chart illustrating comparison processes in the magnitude comparison circuit 19 of Embodiment 1. In FIG. 2, n1 and n2 respectively represent addresses of the two selected devices under test, and N1 and N2 respectively represent electrical measured values of the devices under test in the address n1 and n2.

As illustrated with reference to FIG. 2, the addresses of the two devices under test are first initialized to 1 and 2 in step ST01.

Next, in step ST02, a measured value N1 of the address n1 is compared with a measured value N2 of the address n2. If the measured value N1 is smaller than or equal to the measured value N2, the address n2 of a device under test is updated as the address n1 of a device under test in a next step ST03. Compared to this, if the measured value N1 is greater than the measured value N2, the address n2 is advanced by one address in a next step ST04. Note that, it is also possible to update the address n1 with the address n2 only when the measured value N1 is smaller than the measured value N2 in step ST03.

In a next step ST05, it is determined whether or not a value of the updated address n2 exceeds a final address value, in this case a value of p×q. If it is determined that the value of the updated address n2 does not exceed the final address value, the process is repeated again from step ST02.

On completion of the series of the repeated processes, the magnitude comparison circuit 19 informs the control circuit 20 of the completion of the comparison process in a next step ST06. The control circuit 20 outputs a flag signal notifying the completion to the outside 11 via the second control terminal 31.

As mentioned above, in Embodiment 1, a magnitude comparison between the measured values N1 and N2 of the two selected devices under test is made in such a manner that the address is successively advanced from the first address to the final address, so that it is possible to extract an address of a device under test whose measured value is the maximum value.

After that, upon reception of a completion notification of the magnitude comparison process via the second control terminal 31, the measurement apparatus 33 which monitors operation of the semiconductor inspection circuit device from the outside 11 switches the semiconductor inspection circuit device to the manual measurement mode.

In the semiconductor inspection circuit device switched to the manual measurement mode, the address control circuit 21 reads out the address of the device under test whose measured value held in the address memory circuit 22 is the maximum value, and sets the read-out address in the column selection circuit 14 and the row selection circuit 16. The measurement apparatus 33 in the outside 11 performs a detailed electrical measurement on the device under test having the maximum value via the bus lines 18a and 18b.

As described above, since in an inspection method of the conventional example, an electrical characteristic of all of the p×q devices under test is measured by the measurement apparatus in the outside, it takes several tens of milliseconds to several hundreds of milliseconds per address. However, according to Embodiment 1, it is possible to realize a comparison time of several hundreds of nanoseconds to several microseconds per comparison because the magnitude comparison between the measured values of the devices under test is performed in the semiconductor inspection circuit device. Therefore, even if, for example, 1000 devices under test are fabricated and compared with each other in terms of electrical characteristic, it is possible to extract a device under test whose measured value is the maximum value within several milliseconds. Therefore, according to Embodiment 1, times required for extracting a desired device under test can be shorten by three orders of magnitude.

This enables to obtain an address of the device under test having the maximum value out of, for example, 1000 devices under test in a very short time, which makes it possible to check variation in the fabrication process in a reasonable time.

Figure 3:
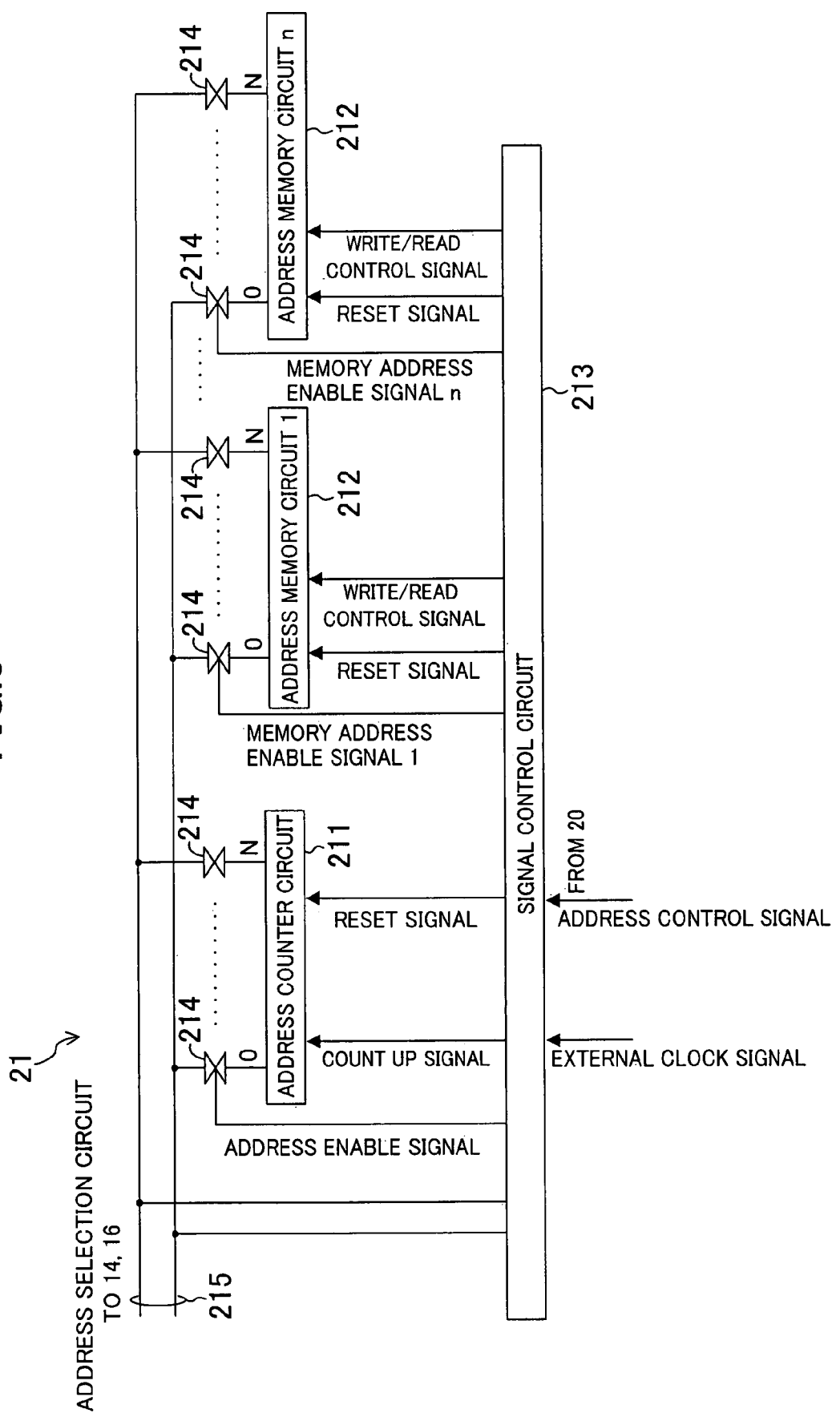
FIG. 3 is a block diagram schematically illustrating an exemplary structure of an address control circuit of Embodiment 1 of the present invention.

FIG. 3 shows an exemplary structure of the address control circuit 21. As shown in FIG. 3, the address control circuit 21 includes an address counter circuit 211, n address memory circuits 212, and a signal control circuit 213.

The address counter circuit 211 is formed by an ordinary binary counter circuit or a shift register circuit. In FIG. 3, an address is output as a binary numerical value of N+1 digits from 0 to N, and it is possible to control up to $2^{N+1}$ addresses. Receiving a count up signal from the signal control circuit 213, the address counter circuit 211 generates addresses such that the addresses are successively advanced by one. Further, the address signals of N+1 digits are output to address signal buses 215 via transfer switches 214 by an address enable signal activated by the signal control circuit 213 and respectively transmitted to the column selection circuit 14 and the row selection circuit 16 shown in FIG. 1.

Each address memory circuit 212 is connected to the address signal buses 215 via each transfer switch 214. By a memory address enable signal and a read/write control signal, each address memory circuit 212 holds an address on the address signal buses 215 and outputs the held address to the address signal buses 215.

According to this structure, it is possible to arbitrarily select two of the addresses arranged in p rows and q columns in the self-contained operation mode by the address control circuit 21, and to make a magnitude comparison between the values of the measured electrical characteristic of the two selected devices under test. Moreover, in the manual measurement mode which is performed after the self contained operation mode in order to evaluate the extracted devices under test, an address of a device under test having the maximum value among the measured values held in the address memory circuit 212 is output to the address signal buses 215, the address having the maximum value is set in the address memory circuit 22, and then the device under test having the maximum value is measured as described above.

Note that, it is also possible that an address successively counted up by the address counter circuit 211 is output to the address signal buses 215 and to set an address which is to be selected to successively measure devices under test, for example, devices under test 12a, 12b, 12c, and 12d.

Variations of Address Control Circuit

Figure 4:
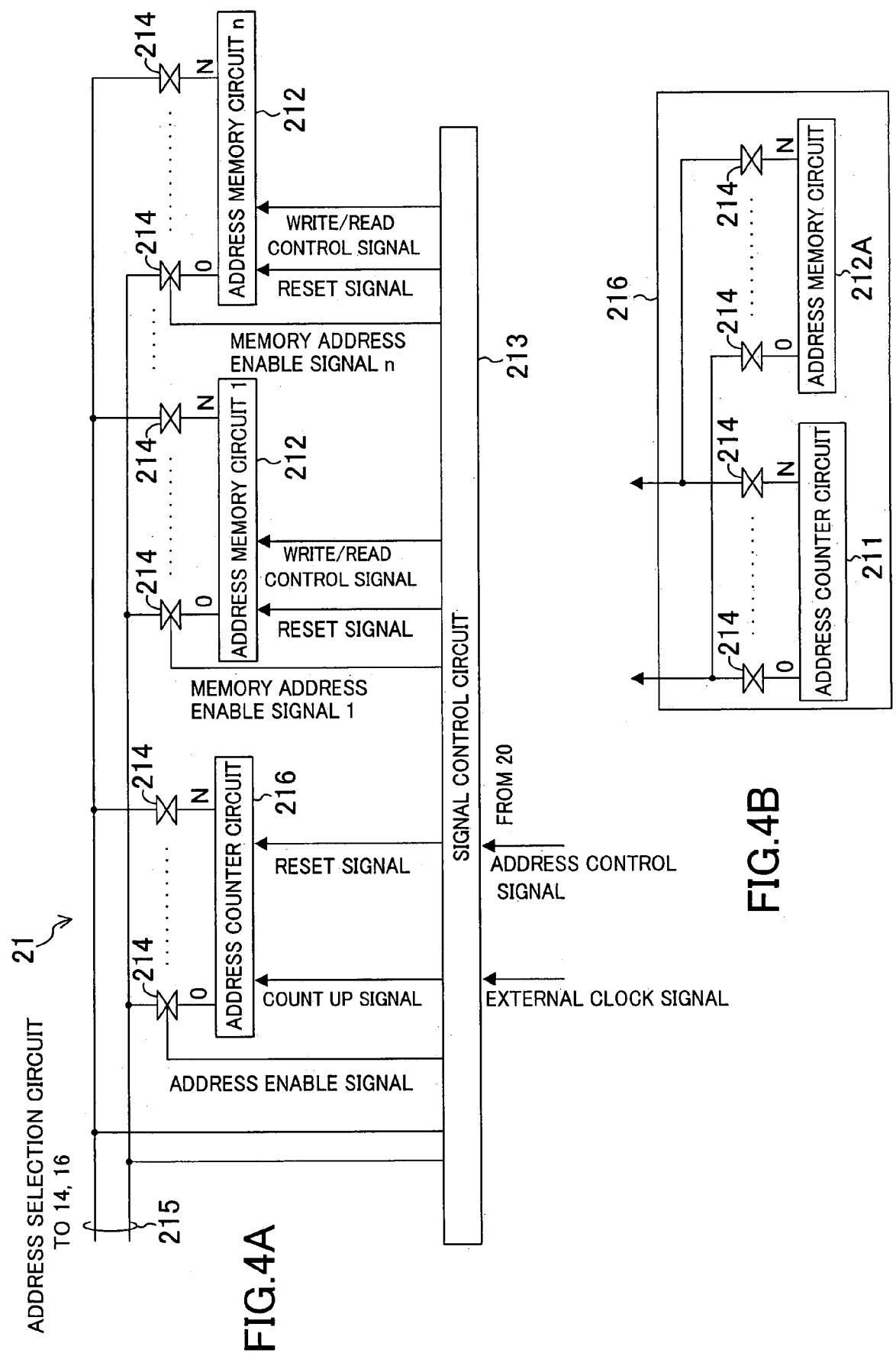
FIG. 4A and FIG. 4B are block diagrams schematically illustrating an exemplary variation of the address control circuit of Embodiment 1 of the present invention.

A variation of the address control circuit of Embodiment 1 will be explained below with reference to FIG. 4A and FIG. 4B. In FIG. 4A and FIG. 4B, the same components as those of FIG. 3 are indicated by the same reference numerals as those of FIG. 3 and descriptions thereof are omitted.

FIG. 4A is a block diagram illustrating an address control circuit 21 of the present variation. The address control circuit 21 according to Embodiment 1 of FIG. 3 enables a measurement of an electrical characteristic of devices under test selected based on addresses generated by the address counter circuit 211 which performs a successive count-up, and a measurement of the electrical characteristic of a device under test having, for example, the maximum value in the extracted address.

Compared to this, the address control circuit 21 of the present variation shown in FIG. 4A includes an address output circuit 216 instead of the address counter circuit 211 of FIG. 3. The address output circuit 216 includes an address counter circuit 211 and an address memory circuit 212A which is connected to the address counter circuit 211 in parallel as shown in FIG. 4B.

The signal control circuit 213 receives an address signal arbitrarily specifying an address of any of a plurality of devices under test, the address signal being input from the outside 11 of the semiconductor inspection circuit device. The address control circuit 21 selects a device under test in the specified address via the signal control circuit 213 which enables the address memory circuit 212A to hold the address specified by the received address signal. In this way, it is possible to evaluate an electrical characteristic of the selected device under test.

Therefore, the address control circuit 21 of the present variation enables to measure an electrical characteristic of a device under test in, for example, an arbitrarily extracted address. Therefore, it is possible to selectively evaluate the variation in the measured values without an electrical measurement of all devices under test.

Figure 5:
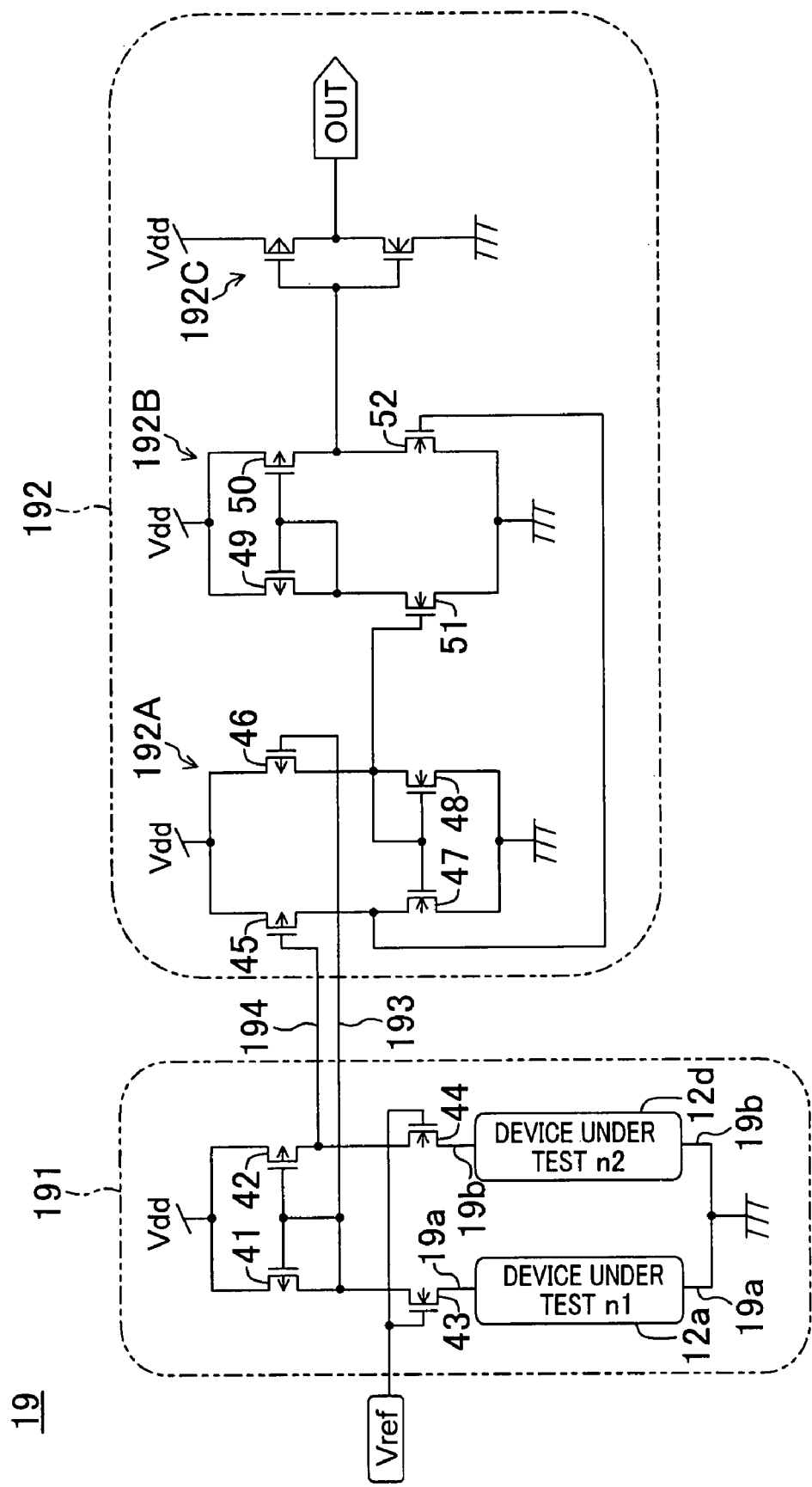
FIG. 5 is a circuit diagram illustrating an exemplary structure of the magnitude comparison circuit of Embodiment 1 of the present invention.

An exemplary structure of the magnitude comparison circuit 19 of Embodiment 1 will be explained below with reference to FIG. 5. As shown in FIG. 5, the magnitude comparison circuit 19 of Embodiment 1 includes a current mirror circuit 191 and a differential amplifier 192.

The current mirror circuit 191 includes: a first PFET 41 and a second PFET 42 which are connected in a current mirror configuration; a first NFET 43 which has the drain connected to the drain of the first PFET 41 and the gate receiving a reference voltage Vref; and a second NFET 44 which has the drain connected to the drain of the second PFET 42 and the gate receiving the reference voltage Vref, wherein a selected device under test, in this case a device under test 12*a*, is inserted as a resistive component between the source of the first NFET 43 and the ground, and a selected device under test, in this case a device under test 12*d*, is inserted as a resistive component between the source of the second NFET 44 and the ground. Therefore, the device under test 12*a* is connected to the first input terminal pair 19*a*, and the device under test 12*d* is connected to the second input terminal pair 19*b* of the magnitude comparison circuit 19 of FIG. 1. The first NFET 43 is serially connected between the PFET 41 and the device under test 12*a*, and the second NFET 44 is serially connected between the PFET 42 and the device under test 12*d*.

The differential amplifier 192 includes a first circuit 192A, a second circuit 192B, and a third circuit 192C.

The first circuit 192A includes: a third PFET 45 which has the source receiving a power supply voltage Vdd and the gate connected to the drain of the second PFET 42; a fourth PFET 46 which has the source receiving the power supply voltage Vdd and the gate connected to the drain of the first PFET 41; a third NFET 47 which has the drain connected to the drain of the third PFET 45 and the source connected to the ground; and a fourth NFET 48 which has the drain connected to the drain of the fourth PFET 46, the gate shared by the gate of the third NFET 47 and connected to the drain of the fourth NFET 48, and the source connected to the ground.

The second circuit 192B includes: a fifth PFET 49 which has the source receiving a power supply voltage Vdd and the gate connected to the drain of the fifth PFET 49; a sixth PFET 50 which has the source receiving the power supply voltage Vdd and the gate connected to the gate of the fifth PFET 49; a fifth NFET 51 which has the drain connected to the drain of the fifth PFET 49, the gate connected to the drain of the fourth NFET 48, and the source connected to the ground; and a sixth NFET 52 which has the drain connected to the drain of the sixth PFET 50, the gate connected to the drain of the third NFET 47, and the source connected to the ground.

The third circuit 192C is an inverter circuit which has an input terminal connected to the drain of the sixth PFET 50 and an output terminal connected to an output terminal OUT. In this case, in the current mirror circuit 191 and in the differential amplifier 192, a node connecting the drain of the first PFET 41 with the gate of the fourth PFET 46 is referred to as a first node 193, and a node connecting the second PFET 42 with the gate of the third PFET 45 is referred to as a second node 194.

In the magnitude comparison circuit 19 having such structure, it is possible to perform a magnitude determination of measured values of an electrical characteristic using a difference in current drivability between the two devices under test 12*a* and 12*d* inserted as the resistive components in the current mirror circuit 191. In a case where, for example, the current amount of the device under test 12*a* is greater than that of the device under test 12*d*, a potential of the first node 193 reduces to a lower value than that of a potential of the second node 194 due to a ground potential. This potential difference between the first node 193 and second node 194 is detected by the differential amplifier 192, and as a result, an "L" potential (low potential) is output to the output terminal OUT.

Specifically, the "L" potential is determined in and output from the third circuit 193C in such a case that a potential of the drain of the fourth PFET 46 increases to a greater value than that of a potential of the drain of the third PFET 45 in the first circuit 192A of the differential amplifier 192 and a potential of the drain of the sixth PFET 50 increases to a greater value than that of a potential of the drain of the fifth PFET 49 in the second circuit 192B. Compared to this, an "H" potential (high potential) is output from the output terminal OUT in such a case that, for example, the current amount of the device under test 12*d* is greater than that of the device under test 12*a*.

In this way, it is possible to determine a magnitude relation of the electrical measured values of the two selected devices under test 12*a* and 12*d*, so that the inspection method described in Embodiment 1 can be realized.

Figure 6A:
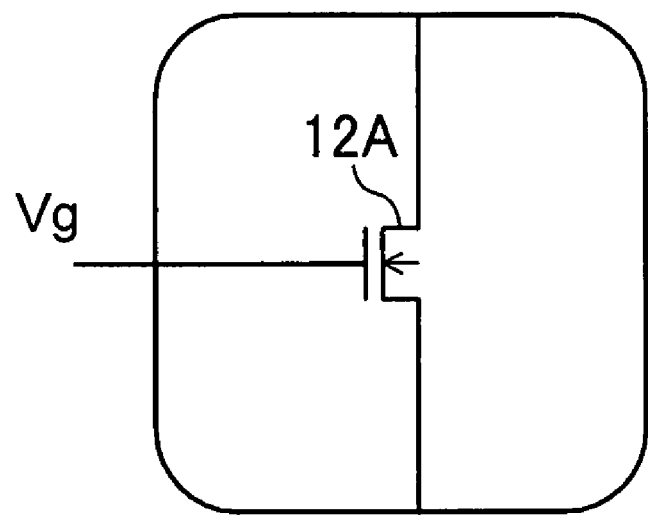
Figure 6B:
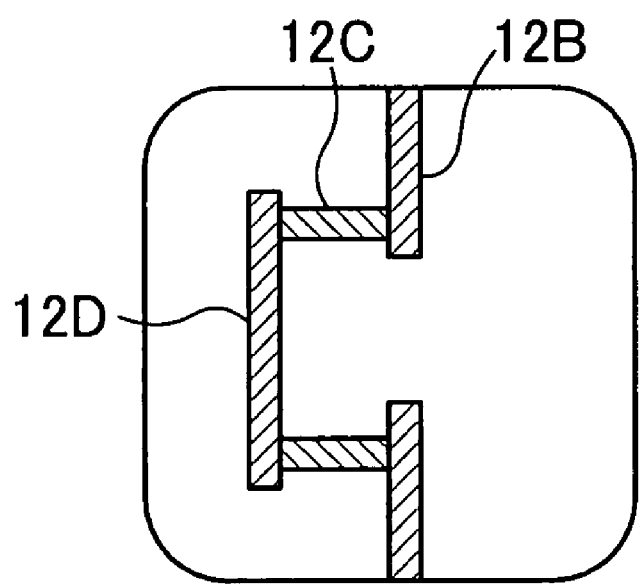

In FIG. 6A and FIG. 6B, a specific example of a device under test, for example, device under test 12*a* is shown. FIG. 6A shows an NFET 12A whose variation in the current drivability can be evaluated by comparison of a current drivability between the source and the drain of such a transistor whose gate potential is controlled to Vg. Note that, it is not limited to NFET that can be evaluated, but of course, PFET can be evaluated.

FIG. 6B shows a contact chain which includes lower layer lines 12B, contacts 12C, and an upper layer line 12D and whose variation in resistance value can be evaluated. The lower layer lines 12B and the upper layer line 12D are formed of, for example, metal or polysilicon having electrical conductivity. Note that, the number of contacts 12C included in the contact chain is not limited to two as shown in FIG. 6B. The contact chain may include more than two serially connected contacts 12C.

Variation 1 of Magnitude Comparison Circuit

Figure 7:
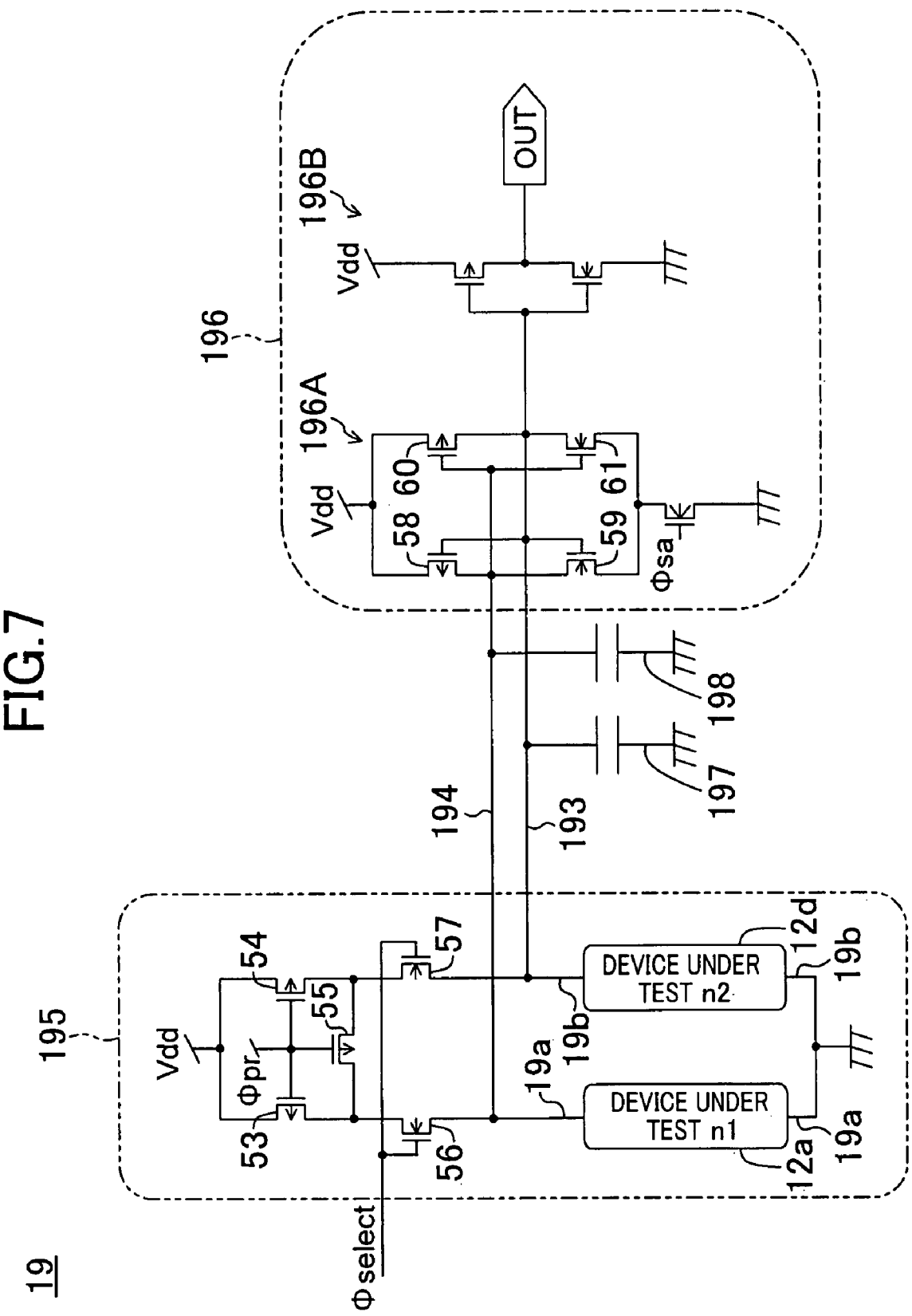
FIG. 7 is a circuit diagram illustrating Variation 1 of the magnitude comparison circuit of Embodiment 1 of the present invention.

Variation 1 of the magnitude comparison circuit of Embodiment 1 will be explained below with reference to FIG. 7.

In Embodiment 1, a structure including the current mirror circuit 191 has been explained as an example of the magnitude comparison circuit 19. Compared to this, in Variation 1, a determination circuit which can perform a comparison determination process in higher speed is used. As shown in FIG. 7, a magnitude comparison circuit 19 of Variation 1 includes a precharge circuit 195 and a sense amplifier 196.

The precharge circuit 195 includes: a first PFET 53 and a second PFET 54 which have sources receiving a power supply voltage Vdd and a common gate receiving a precharge voltage φpr; a third PFET 55 which has the gate receiving the precharge voltage φpr, and the source and the drain respectively connected to the drain of the first PFET 53 and the drain of the second PFET 54; a first NFET 56 which has the drain connected to the drain of the first PFET 53 and the gate receiving a selection signal φselect; and a second NFET 57 which has the drain connected to the drain of the second PFET 54 and the gate receiving the selection signal φselect. Between the source of the first NFET 56 and the ground, a selected device under test, in this case a device under test 12*a* is inserted as a resistive component. Between the source of the second NFET 57 and the ground, a selected device under test, in this case a device under test 12*d* is inserted as a resistive component.

The sense amplifier 196 includes a first circuit 196A and a second circuit 196B.

In the first circuit 196A, input/output terminals of a first inverter including a fourth PFET 58 and a third NFET 59 and a second inverter including a fifth PFET 60 and a fourth NFET 61 are connected with each other, forming a so-called flip-flop connection.

The second circuit 196B is an inverter circuit which has an input terminal connected to an output terminal of the second inverter and an output terminal connected to the output terminal OUT.

Moreover, parasitic resistances such as the row selection lines 15a and 15c and the bus lines 18a and 18c are respectively connected as capacitance elements 197 and 198 to the first node 193 and the second node 194.

In the magnitude comparison circuit 19 having such structure, it is possible to perform a magnitude determination of measured values of an electrical characteristic using a difference in current drivability between the two devices under test 12a and 12d inserted as the resistive components in the precharge circuit 195.

Figure 8:
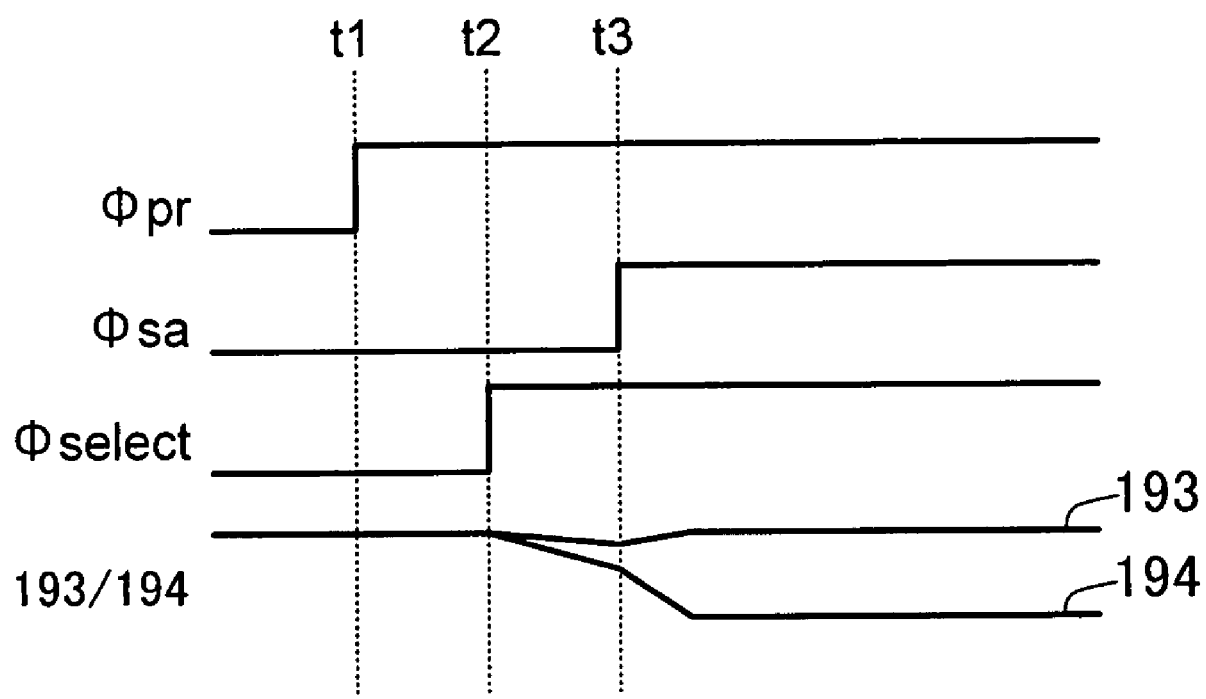
FIG. 8 is a timing chart of Variation 1 of the magnitude comparison circuit of Embodiment 1 of the present invention.

Operation of the magnitude comparison circuit 19 of Variation 1 will be explained with reference to the timing chart in FIG. 8. In the timing chart in FIG. 8, the precharge signal φpr has the "L" potential until a time t1. At the time t1, a transition of the precharge signal φpr to the "H" potential is effected. This deactivates the first PFET 53, the second PFET 54, and the third PFET 55.

Next, at a time t2, a transition of the selection signal φselect to the "H" potential is effected to activate the first NFET 56 and the second NFET 57. As a result, an electric charge precharged in the drain of the NFET 56 and the drain of the NFET 57 flows into the device under test 12a and the device under test 12b. This causes a gradual transition of potential of the first node 193 and the second node 194 to the "L" potential due to a current flowing through the devices under test 12a and 12d. In this case, if there is a difference in current drivability between the devices under test 12a and 12d, a potential difference arises between the first node 193 and the second node 194. For example, in a case where the current drivability of the device under test 12a is greater than that of the device under test 12d, the potential of the second node 194 more quickly reduces than the potential of the first node 193 reduces. The resulted potential difference is amplified by the sense amplifier 196 which is activated by the sense amplifier enable signal φsa activated at the time t3, so that a determination result, that is, the "L" potential is output to the output terminal OUT.

In this way, also in Variation 1, it is possible to determine the magnitude relation of measured values of the electrical characteristic of the devices under test 12a and 12d, so that the inspection method described in Embodiment 1 can be realized.

In Variation 2 (not shown), a D/A converter may be used instead of the sense amplifier 196 of Variation 1. The D/A converter is used to convert a potential difference in obtained measured values to a digital signal value, which makes it possible to compare the measured values with each other in terms of magnitude.

As described above, Embodiment 1 enables an inspection of enormous numbers of devices under test in a reasonable time, which was substantially difficult in the conventional inspection method.

In Embodiment 1, it has been explained a case where devices under test 12a, 12b, 12c, and 12d are two-dimensionally arranged in rows and columns. However, in order to form the devices under test in a scribe line region of the semiconductor wafer 10, it is of course possible that the devices under test are one-dimensionally arranged. Note that, the semiconductor inspection circuit of Embodiment 1 is not necessary to be formed in the scribe line region of the semiconductor wafer 10.

Embodiment 2

Embodiment 2 of the present invention will be described below with reference to the drawings.

Figure 9:
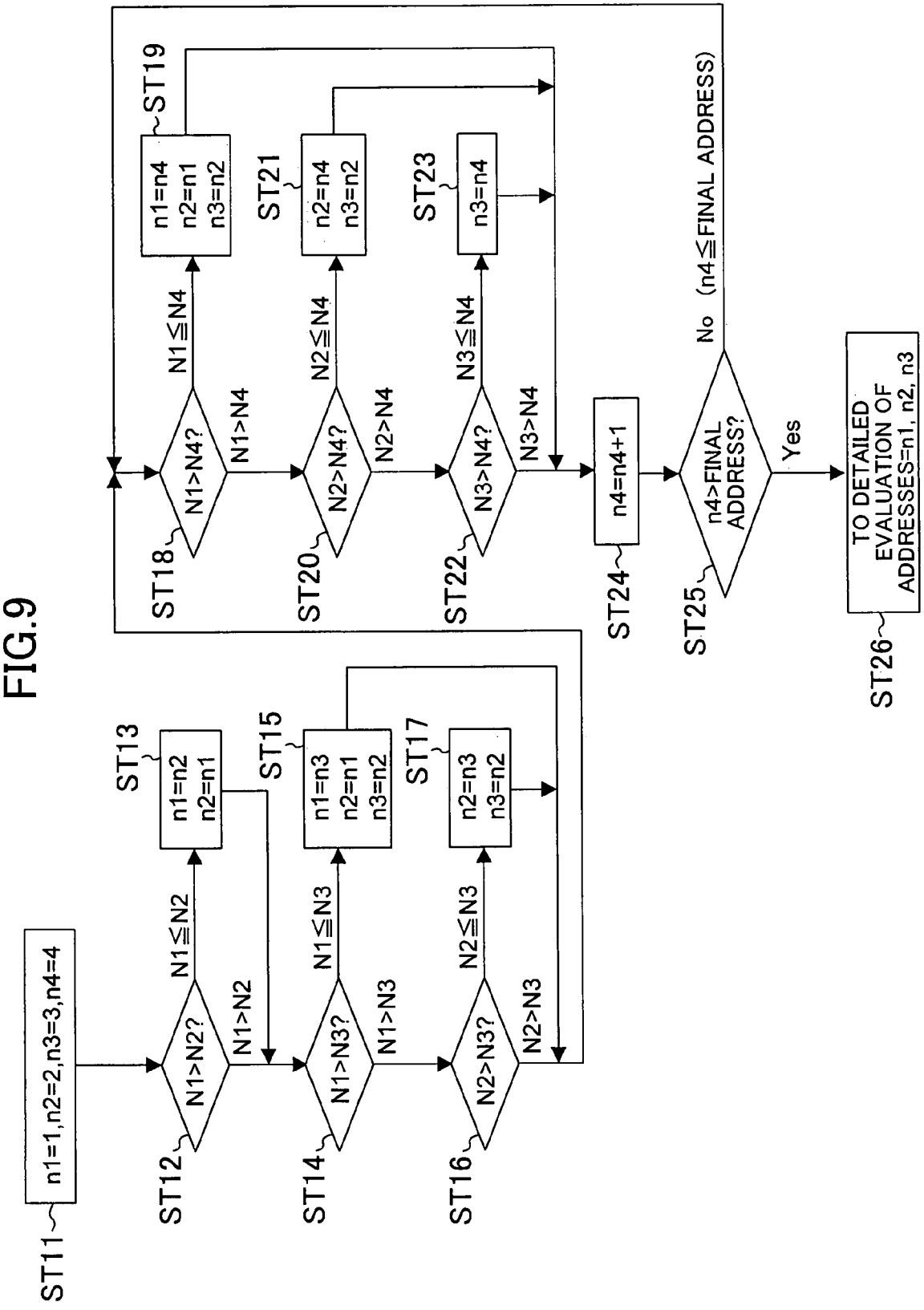
FIG. 9 is a flow chart illustrating comparison processes in a magnitude comparison circuit of Embodiment 2 of the present invention.

FIG. 9 shows an exemplary flow chart illustrating a magnitude comparison determination method of a semiconductor inspection circuit device of Embodiment 2 of the present invention.

In Embodiment 1 of FIG. 1, the method has been explained in which in the self-contained operation mode, an address of a device under test having the maximum value or the minimum value among measured values of an electrical characteristic is extracted, and only the electrical characteristic of the device under test in the address is measured in detail. In Embodiment 2, a memory area of the address memory circuit 22 of Embodiment 1 is further provided and a magnitude comparison determination process illustrated with reference to FIG. 9 is performed, so that it is possible to extract not only an address of a device under test having the maximum value or the minimum value among the measured values, but also addresses having measured values within a predetermined range (number) from the maximum value or the minimum value.

In this way, obtaining not only the maximum value or the minimum value among the measured values but also measured values within a predetermined range makes it is possible to more certainly determine a possibility of the obtained maximum value or the minimum value being a particular abnormal value, existence of variation in measured values, or the magnitude of variation itself.

FIG. 9 shows an exemplary process flow to extract addresses according to at most three descending measured values including the maximum value. The address memory circuit 22 is provided with a memory circuit which memorizes first through third addresses (n1 through n3) in descending order and a memory circuit which memorizes a fourth address (n4) used for a comparison. In FIG. 9, N1 through N4 respectively represent electrical measured values of devices under test in the corresponding addresses n1 through n4.

As shown in FIG. 9, first in step ST11, the addresses n1 through n4 of four devices under test are respectively initialized to 1, 2, 3, and 4.

Next, in step ST12, a measured value N1 of a device under test in the address n1 is compared with a measured value N2 of a device under test in the address n2. If the measured value N1 is smaller than or equal to the measured value N2, the address n2 of the device under test is updated as the address n1 of the device under test, and the address n1 of the device under test is updated as the address n2 of the device under test in a next step ST13. In this case, a value (=1) which is stored in the address n1 prior to update is temporary saved in, for example, a register. Likewise, contents in the addresses n2 and n3 have to be saved before the addresses n2 and n3 are updated.

Next, in step ST14, the measured value N1 of the device under test in the address n1 is compared with a measured value N3 of a device under test in the address n3. If the measured value N1 is smaller than or equal to the measured value N3, the address n3 of the device under test is updated as the address n1 of the device under test, the address n1 of the device under test is updated as the address n2 of the device under test, and the address n2 of the device under test is updated as the address n3 of the device under test in a next step ST15. In a case where the process in step ST15 is performed, the process proceeds to step ST18.

Next, in step ST16, the measured value N2 of the device under test in the address n2 is compared with the measured value N3 of the device under test in the address n3. If the measured value N2 is smaller than or equal to the measured value N3, the address n3 of the device under test is updated as the address n2 of the device under test, and the address n2 of the device under test is updated as the address n3 of the device under test in a next step ST17.

After the steps ST11 through ST17, the measured values of an electrical characteristic of the devices under test indicated by the initial addresses 1, 2, and 3 are stored in the addresses n1, n2, and n3 in descending order.

Next, in step ST18, the measured value N1 of the device under test in the address n1 is compared with a measured value N4 of a device under test in the address n4. If the measured value N1 is smaller than or equal to the measured value N4, the address n4 of the device under test is updated as the address n1 of the device under test, the address n1 of the device under test is updated as the address n2 of the device under test, and the address n2 of the device under test is updated as the address n3 of the device under test in a next step ST19. If the process in step ST19 is performed, the process proceeds to step ST24.

Next, in step ST20, the measured value N2 of the device under test in the address n2 is compared with the measured value N4 of the device under test in the address n4. If the measured value N2 is smaller than or equal to the measured value N4, the address n4 of the device under test is updated as the address n2 of the device under test, and the address n2 of the device under test is updated as the address n3 of the device under test in a next step ST21. If the process in step ST21 is performed, the process proceeds to step ST24.

Next, in step ST22, the measured value N3 of the device under test in the address n3 is compared with the measured value N4 of the device under test in the address n4. If the measured value N3 is smaller than or equal to the measured value N4, the address n4 of the device under test is updated as the address n3 of the device under test in a next step ST23.

After the steps ST18 through ST23, three addresses among the devices under test in the initialized addresses 1, 2, 3, and 4 are stored in the addresses n1, n2, and n3 in descending order of the measured values of the electrical characteristic.

Next, the address n4 is advanced by one address in step ST24, and if a value of the address n4 does not exceed a final address value in step ST25, the steps ST18 through ST25 are repeated.

The steps ST18 through ST25 are successively repeated until the value of an address stored in the address n4 corresponds to the final address value. As a result, addresses of devices having greater electrical characteristic among all devices under test are eventually stored in n1 through n3 in descending order.

Next, in step ST26, in the manual measurement mode, the addresses of the device under test having the maximum value and two devices under test respectively having the second greatest measured value and the third greatest measured value are read out of the address memory circuit, and the electrical characteristic of each of the devices under test in the read-out addresses is measured by the measurement apparatus 33 in the outside 11. As described above, repeating the comparison process as many times as necessary makes it possible to extract addresses of devices in descending order of the measured values from the maximum value to, for example, a tenth value. After that, while the extracted addresses are successively read out, devices under test in the read-out addresses are measured.

In Embodiment 2, addresses of more than one device under test having the maximum value and the next greatest measured value in descending order among measured values of a plurality of devices under test are extracted. However, it will be appreciated that addresses of more than one device under test having the minimum value and the next smallest measured value in ascending order among the measured values may be extracted.

As explained above, according to Embodiment 2, not only the maximum value and the minimum value among the measured values but also measured values close to the maximum value or to the minimum value within a predetermined range are measured, which makes it possible to check the variation in the fabrication process within a short time.

Embodiment 3

Embodiment 3 of the present invention will be explained below with reference to the drawings.

Figure 10:
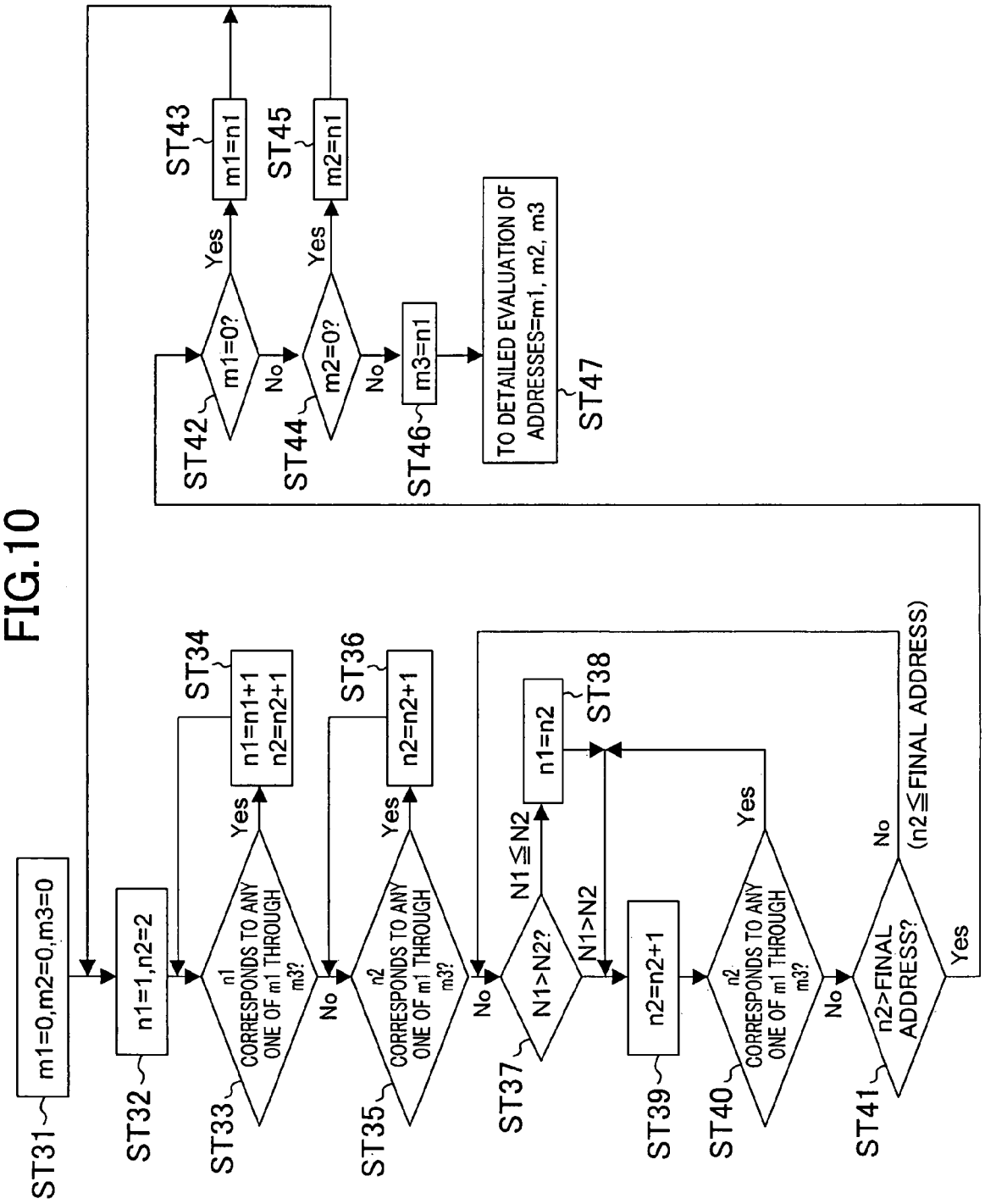
FIG. 10 is a flow chart illustrating comparison processes in a magnitude comparison circuit of Embodiment 3 of the present invention.

FIG. 10 is an exemplary flow chart illustrating a magnitude comparison determination method of a semiconductor inspection circuit device of Embodiment 3 of the present invention.

Embodiment 2 employs the method as shown in FIG. 9 in which magnitude relations of a plurality of measured values are successively compared, and contents in the addresses n1 through n3 are replaced according to results obtained by the comparison. In order to perform the replacement process of memory contents in the semiconductor inspection circuit device, a temporary memory circuit is required to save information prior to replacement (update). Moreover, a circuit for replacing information is required, which causes an increase in circuit size.

To cope with the problem, Embodiment 3 is realized such that the magnitude comparison determination can be performed in a simpler circuit structure. As a specific example, there will be described a method to extract addresses having three measured values including the maximum value among measured values of an electrical characteristic of a plurality of devices under test.

As illustrated with reference to FIG. 10, memory circuits (registers) m1, m2 and m3 for holding the maximum value are used, and addresses of the devices under test are successively updated and measured values of the devices under test in the updated addresses are compared with each other. This method is the same as that of Embodiment 2. However, before setting address, it is confirmed whether or not a device in an address which is to be compared corresponds to an address having the maximum value among the measured values.

That is, as illustrated with reference to FIG. 10, the registers m1 through m3 are first initialized to 0 in step ST31.

Next, in step ST32, addresses n1 and n2 of two devices under test are respectively initialized to 1 and 2.

Then, in step ST33, it is determined whether or not the address n1 corresponds to any one of the registers m1 through m3. If it is determined that the address n1 corresponds to any one of the registers m1 through m3, the addresses n1 and n2 are advanced by one address in a next step ST34. Then, the process returns to step ST33.

After that, in step ST35, it is determined whether or not the address n2 corresponds to any one of the registers m1 through m3. If it is determined that the address n2 corresponds to any one of the registers m1 through m3, the address n2 is advanced by one address in a next step ST36. Then, the process returns to step ST35.

Next, in step ST37, a measured value N1 of a device under test in the address n1 is compared with a measured value N2 of a device under test in the address n2. If the measured value N1 is smaller than or equal to the measured value N2, the address n2 of the device under test is updated as the address n1 of the device under test in a next step ST38.

Next, in step ST39, the address n2 is advanced by one address.

Next, in step ST40, it is determined whether or not the address n2 corresponds to any one of the registers m1 through m3. If it is determined that the address n2 corresponds to any one of the registers m1 through m3, the address n2 is advanced by one address in the previous step ST39, and then, the process returns to step ST40.

Next, in step ST41, if the value of the address n2 does not exceed the final address value, the steps ST37 through ST41 are repeated.

Next, in step ST42, if a content of the register m1 is 0, that is, if the process is in a first round, the maximum value among the measured values is obtained through the steps ST37 through ST41 is stored in the register m1 in a next step ST43. After that, the process is repeated from step ST32.

In the process in a second round from step ST32, that is, if content in the register m2 is 0 in step ST44, the second greatest value among the measured values is stored in the register m2 in step ST45. In the process in a third round from step ST32, that is, in step ST46, the third greatest value among the measured values is stored in the register m3.

As described above, in Embodiment 3, the initial addresses 1 and 2 are successively stored in n1 and n2, which are the address counters. However, if the address 1 or 2 has been stored as an address corresponding to, for example, the maximum value m1 or the second largest value m2 in the n1 or n2, theses addresses are skipped and a magnitude determination is not performed thereon. Therefore, the replacement process of the memory information as explained in step ST13 of Embodiment 2 is not necessary, which simplifies the circuit structure compared to that of Embodiment 2.

Embodiment 4

Embodiment 4 of the present invention will be explained below with reference to the drawings.

Figure 11:
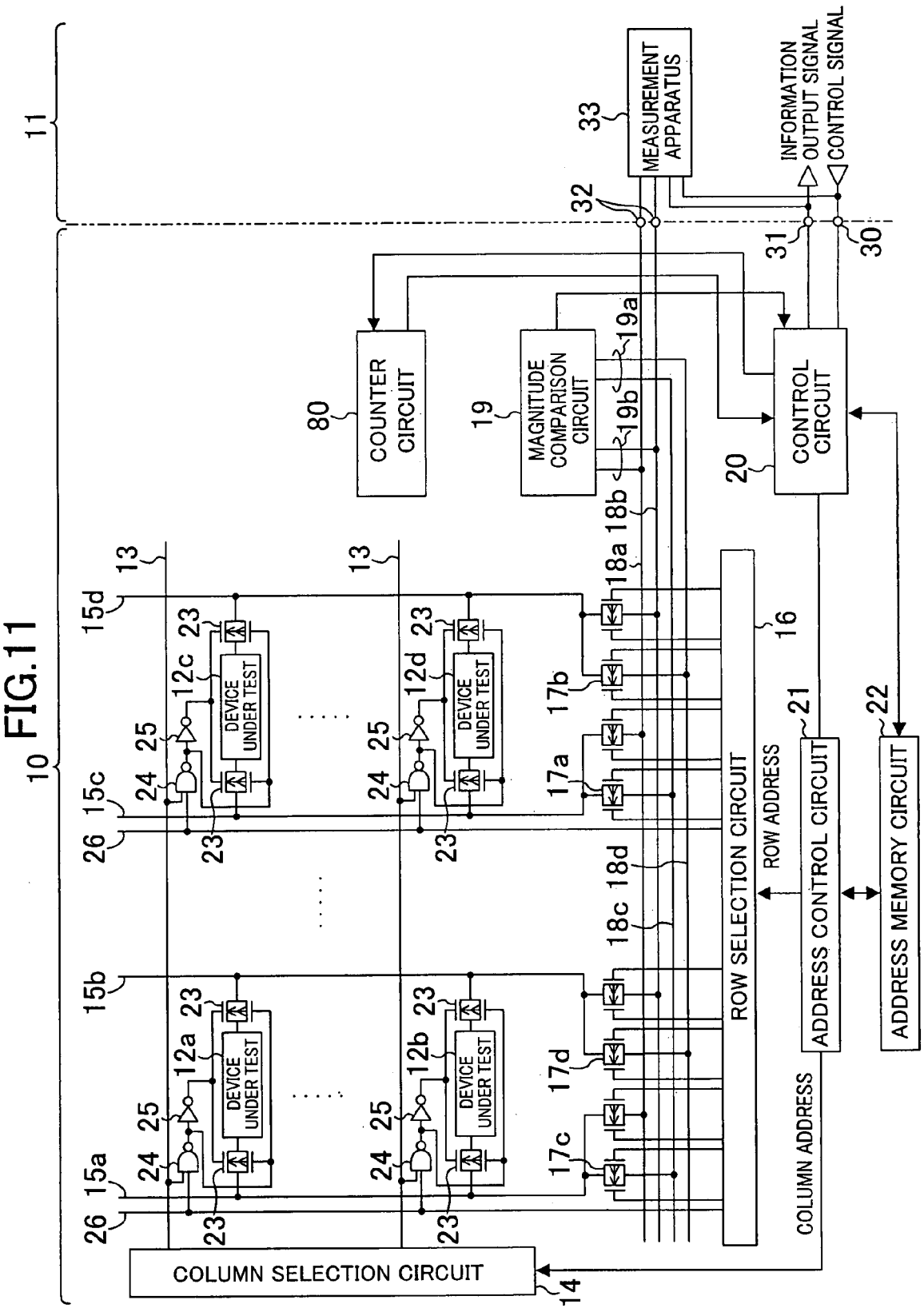
FIG. 11 is a block diagram schematically illustrating a semiconductor integrated circuit device of Embodiment 4 of the present invention.

FIG. 11 is a block diagram illustrating a semiconductor inspection circuit device, which is a semiconductor integrated circuit device of Embodiment 4 of the present invention. In FIG. 11, the same components as those of FIG. 1 are indicated by the same reference numerals as those of FIG. 1, and descriptions thereof are omitted.

As shown in FIG. 11, a semiconductor inspection circuit device of Embodiment 4 further includes a counter circuit 70. After a magnitude determination is made between two measured values, the counter circuit 70 counts the number of devices which are determined to be devices under test having greater or smaller measured values.

The control circuit 20 is set to a self-contained operation mode as a first operation mode and to a manual measurement mode as a second operation mode. In the self-contained operation mode, according to a control signal input from the outside 11, a magnitude comparison is made between values of an electrical characteristic of devices under test in a self-contained manner in the semiconductor inspection circuit, and results of the comparison are counted and the counted number is held in the counter circuit 70. On completion of the comparison process performed on all devices under test, a flag signal notifying the completion is output to the outside 11. In the manual measurement mode, information as to stored address is read as externally controlled from the outside 11 and the read address is set in the column selection circuit 14 and the row selection circuit 16 to allow an measurement of the electrical characteristic of a device under test, for example, device under test 12a, via the bus lines 18a and 18b by the measurement apparatus 33 in the outside 11.

Being set to the self-contained operation mode, the control circuit 20 arbitrarily selects one device from a plurality of devices under test 12a, 12b, 12c, and 12d. Then, an address of the arbitrarily selected device is stored in the address memory circuit 22. Then, one of the other devices excepting the arbitrarily selected device is successively selected, and compared with the arbitrary selected device in terms of measured value. The number of devices having greater values or smaller values is counted up and held in the counter circuit 70.

The self-contained operation mode of the semiconductor inspection circuit device of Embodiment 4 will be described below. Here, provided that an arbitrary device is, for example, the device under test 12d and each of the other devices under test is, for example, the device under test 12a in FIG. 11, a description is provided of a case where measured values of an electrical characteristic are compared with each other.

First, the control circuit 20 controls the address control circuit 21 such that address signals for selecting each of the selection switches 23 of the device under test 12a and the device under test 12d are output to the column selection circuit 14 and the row selection circuit 16.

Subsequently, an address of the arbitrarily selected device under test 12d is stored in the address memory circuit 22.

Next, the selected device under test 12a is connected to the column lines 15a and 15b, while the selected device under test 12d is connected to the column lines 15c and 15d. Further, the column selection switches 17a through 17d are selected to connect the device under test 12a to the first input terminal pair 19a of the magnitude comparison circuit 19 via the bus lines 18c and 18d, and the device under test 12d to the second input terminal pair 19b of the magnitude comparison circuit 19 via the bus lines 18a and 18b.

The magnitude comparison circuit 19 makes a comparison between the device under test 12a and the device under test 12d in terms of electrical characteristic, such as impedance characteristic, wherein the electrical characteristic of the device under test 12a is input to the first input terminal pair 19a and the electrical characteristic of the device under test 12d is input to the first input terminal pair 19b. Then, the magnitude comparison circuit 19 returns a flag signal to the control circuit 20, the flag signal representing the input terminal pair 19a or 19b having a greater value or a smaller value of the electrical characteristic.

Upon reception of the flag signal, the control circuit 20 outputs a signal with which the value stored in the counter circuit 70 is counted up by one, for example, in a case where the first input terminal pair 19a has a greater value (or a smaller value). The counter circuit 70 holds the counted number.

Subsequently, an address of the device under test 12a is advanced by one to proceed with a next comparison process, the device under test 12a being first selected after the arbitrarily selected device under test 12d. This comparison process is successively repeated to compare the arbitrary device with all the other devices in terms of measured value. After that, the control circuit 20 extracts the number counted up in the counter circuit 70. If the extracted number is one half or close to one half of the total number of the devices under test, it is concluded that an address of a device under test having a median or a value close to the median among a plurality of measured values is extracted in the address memory circuit 22.

If the number obtained in the counter circuit 70 is not about one half of the total number of the devices under test, an arbitrary device under test is newly selected, and the comparison process mentioned above is repeated as many times as necessary to obtain the number being about one half of the total number of the devices. In this way, it is possible to extract an address of a device having a median or a measured value close to the median among the measured values of a plural number of devices.

Figure 12:
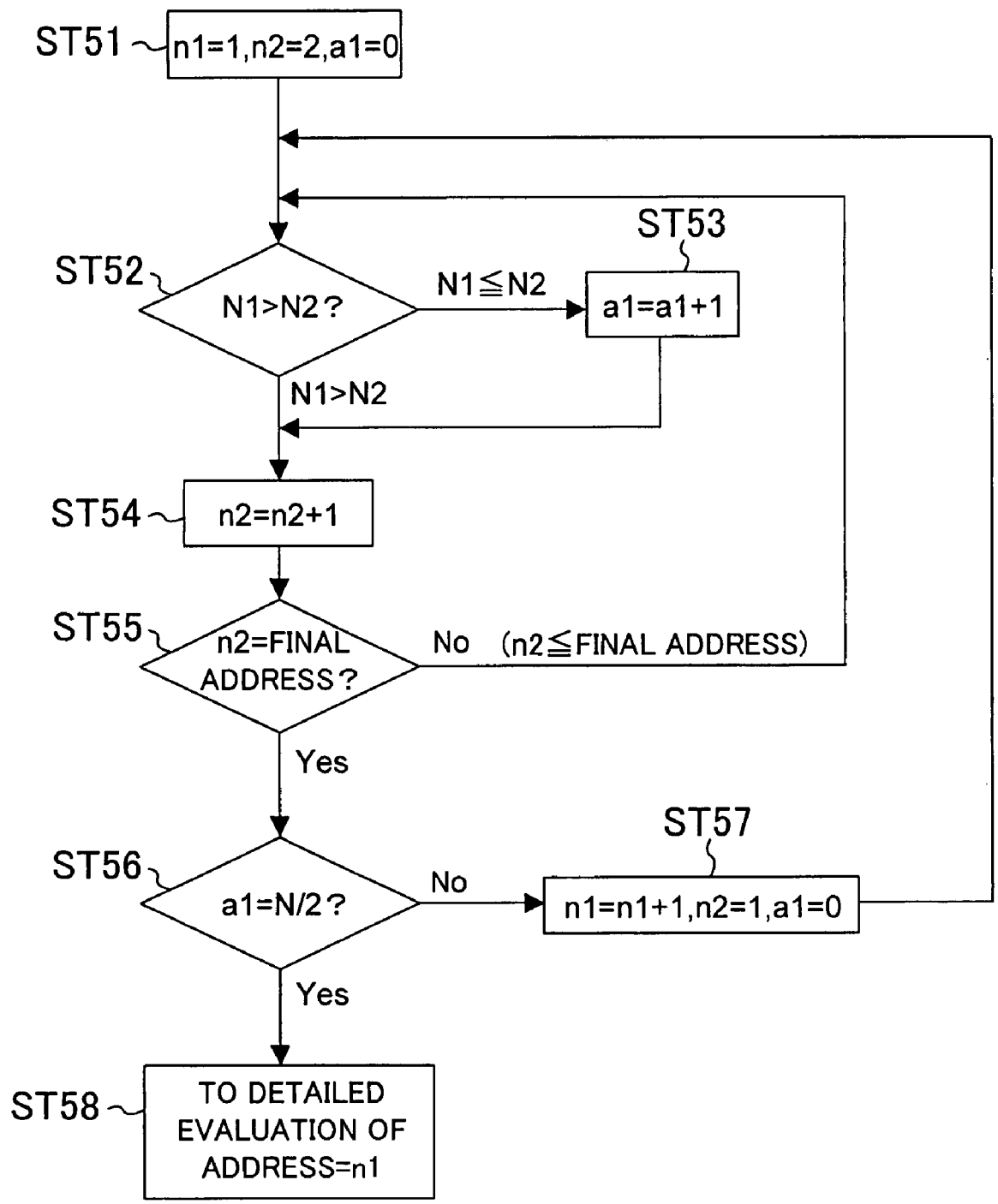
FIG. 12 is a flow chart illustrating comparison processes in a magnitude comparison circuit of Embodiment 4 of the present invention.

FIG. 12 shows an exemplary flow chart of comparison processes in the magnitude comparison circuit 19 of Embodiment 4. In FIG. 12, n1 and n2 respectively represent addresses of the two selected devices under test, N1 and N2 respectively represent electrical measured values of the devices under test in the address n1 and n2, N is a total number of the devices under test, and a1 is a counter which is provided in the counter circuit 70 and which holds the number of devices where the relation N1≦N2 holds true.

As illustrated with reference to FIG. 12, the addresses of the two devices under test are respectively initialized to 1 and 2, and the counter a1 is first initialized to 0 in step ST51.

Next, in step ST52, a measured value N1 in the address n1 is compared with a measured value N2 in the address n2 in terms of magnitude. If the measured value N1 is smaller than or equal to the measured value N2, the counter a1 counts up by one in a next step ST53.

Next, in step ST54, the address n2 is advanced by one address.

In a next step ST55, it is determined whether or not a value of the updated address n2 exceeds a final address value. If it is determined that the value of the updated address n2 does not exceed the final address value, the process is repeated from step ST52.

Next, if the number counted up in counter a1 is or about N/2 in step ST56, it is concluded that an address of a device under test which has a value close to the median among the measured values of the electrical characteristic is extracted.

Compared to this, if the number in the counter a1 is not about N/2, the address n1 is advanced by one address, the address n2 is initialized to 1, and the counter a1 is initialized to 0 in step ST57. After that, the process is repeated from step ST52 as many times as that the number counted up in the counter a1 reaches about N/2.

Upon completion of the series of the repeated processes, the magnitude comparison circuit 19 informs the completion of the comparison processes of the control circuit 20 in a next step ST58. The control circuit 20 outputs a flag signal notifying the completion to the outside 11 via the second control terminal 31.

The measurement apparatus 33 monitoring the second control terminal 31 outputs a control signal which notifies the manual measurement mode to the semiconductor inspection circuit device to switch the semiconductor inspection circuit to the manual measurement mode.

Receiving the control signal, the semiconductor inspection circuit device reads out of the address memory circuit 22, an address of the device under test having the value close to the median among the measured values of the electrical characteristic. This read address is set in the column selection address 14 and the row selection address 16 such that the measurement apparatus 33 initiates a detailed electrical measurement of the device under test having the value close to the median among the measured values.

As explained above, since in the inspection method of the conventional example, the electrical characteristic of p×q devices under test is measured by the measurement apparatus in the outside, several tens of milliseconds to several hundreds of milliseconds per address are required. However, since in Embodiment 4, a magnitude comparison between the measured values of devices under test is made in the semiconductor inspection circuit device, it is possible to realize a comparison time of several hundreds of nanoseconds to several microseconds per comparison at the longest. Therefore, even if 1000 devices under test are fabricated and compared with each other, it is possible to extract a device under test whose measured value is close to the median within several milliseconds.

As mentioned above, according to Embodiment 4, it is possible to inspect enormous numbers of devices within a short time whereas it was practically difficult for the conventional method to perform an inspection measurement on such enormous numbers of devices. Moreover, according to Embodiment 4, it is possible to check a level of quality of fabrication process using a median among the obtained measured values.

In Embodiment 4, it has been explained with reference to a case where the devices under test 12a, 12b, 12c, and 12d are two-dimensionally arranged in rows and columns. However, in order to form the devices under test in a scribe line region in the semiconductor wafer 10, it is of course possible to one-dimensionally arrange the devices under test. Note that, the semiconductor inspection circuit device of Embodiment 4 is not necessary to be formed in the scribe line region of the semiconductor wafer 10.

The address control circuit 21 and the magnitude comparison circuit 19 may adopt each variation described in Embodiment 1.

Embodiment 5

Embodiment 5 of the present invention will be explained below with reference to the drawings.

Figure 13:
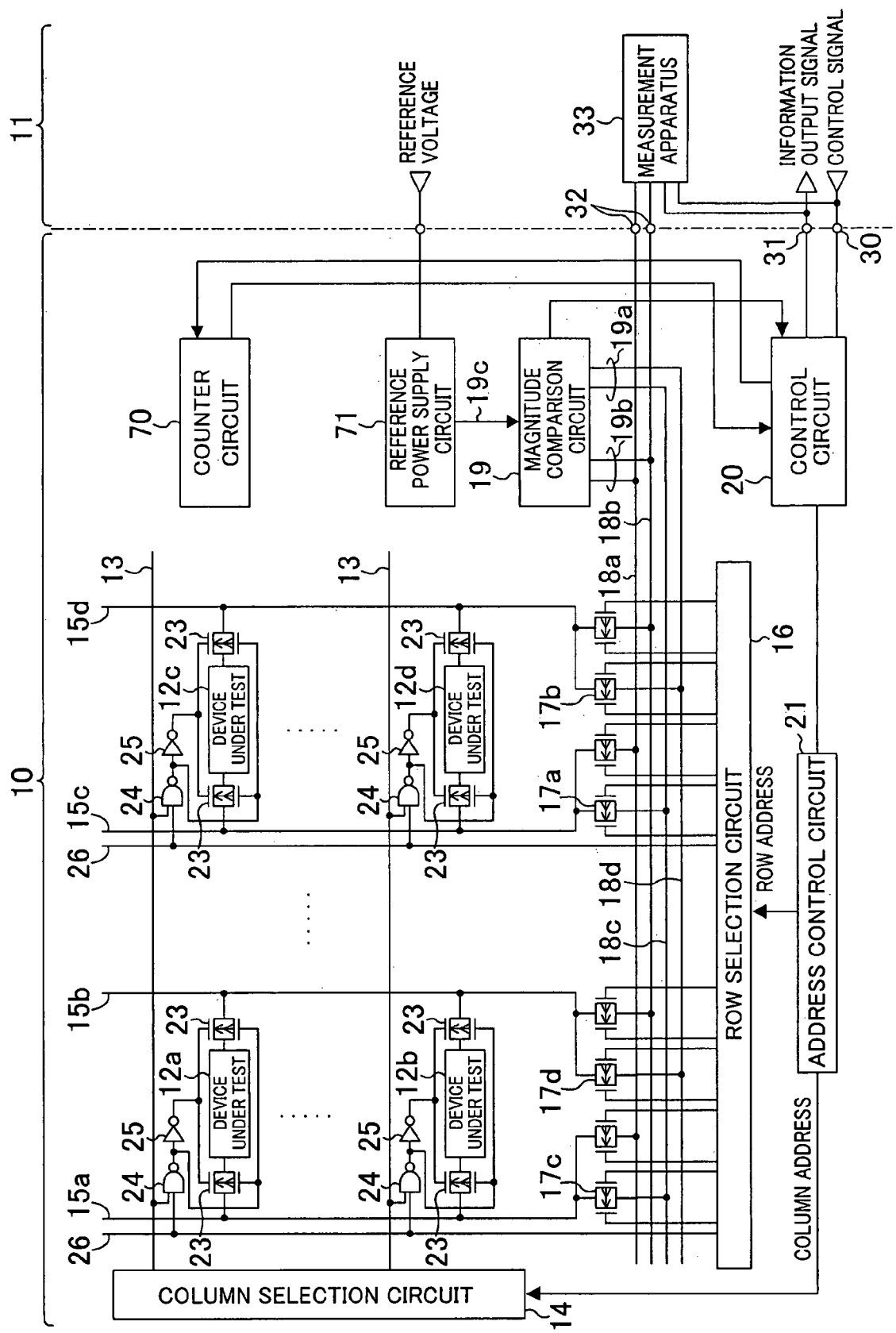
FIG. 13 is a block diagram schematically illustrating a semiconductor integrated circuit of Embodiment 5 of the present invention.

FIG. 13 is a block diagram illustrating a semiconductor inspection circuit device, which is a semiconductor integrated circuit device of Embodiment 5 of the present invention. In FIG. 13, the same components as those of FIG. 1 and FIG. 11 are indicated by the same reference numerals as those of FIG. 1 and FIG. 11, and descriptions thereof are omitted.

As shown in FIG. 13, the semiconductor inspection circuit device of Embodiment 5 is provided with a reference power supply circuit 71. Receiving a reference voltage input from the outside 11, the reference power supply circuit 71 outputs a reference voltage used as a reference for a magnitude determination of electrical measured values. The address memory circuit 22 is not provided.

The control circuit 20 operates in the self-contained operation mode. In the self-contained operation mode, according to a control signal input from the outside 11, a comparison is made between a value of an electrical characteristic of each device under test and the reference voltage in the semiconductor inspection circuit in a self-contained manner, and results of the comparison are counted up in the counter circuit 70. On completion of the comparison process performed on all devices under test, a flag signal notifying the completion is output to the outside 11. Then, the value (the number of devices) counted up in the counter circuit 70 is output to the second control terminal 31.

In the self-contained operation mode, the control circuit 20 arbitrarily selects one of devices under test. A voltage which is an electrical characteristic of the selected device is compared with the reference voltage. If the voltage of the selected device is greater or smaller than the reference voltage, a value stored in the counter circuit 70 is counted up. This comparison process is successively performed on all devices under test.

An exemplary self-contained operation mode of the semiconductor inspection circuit device of Embodiment 5 will be described below. Here, provided that an arbitrary device is, for example, the device under test 12a in FIG. 13, a description is provided of a case where a measured value of the device under test 12a is compared with the reference voltage.

First, the control circuit 20 controls the address control circuit 21 such that address signals for selecting each of the selection switches 23 of the device under test 12a and the device under test 12d are output to the column selection circuit 14 and the row selection circuit 16.

Next, the selected device under test 12a is connected to the column lines 15a and 15b. Further, the column selection switches 17a and 17d are selected to connect the device under test 12a to the first input terminal pair 19a of the magnitude comparison circuit 19 via the bus lines 18c and 18d.

The magnitude comparison circuit 19 makes a comparison between an electrical characteristic, for example, impedance characteristic of the device under test 12a input to the first input terminal pair 19a and the reference voltage input from the reference power supply circuit 71 to a reference voltage input terminal 19c, and returns a flag signal to the control circuit 20, the flag signal indicating the input terminal pair 19a or the reference voltage input terminal 19c having a greater or smaller value.

Upon reception of the flag signal, the control circuit 20 outputs a signal with which the value stored in the counter circuit 70 is counted by one, for example, in a case where the first input terminal pair 19a has a greater value (or a smaller value). The counter circuit 70 holds the counted number.

The process of comparing with the reference voltage is performed on all devices under test. As a result, the number of devices under test whose measured values are greater or smaller than the reference voltage is held in the counter circuit 70.

Figure 14:
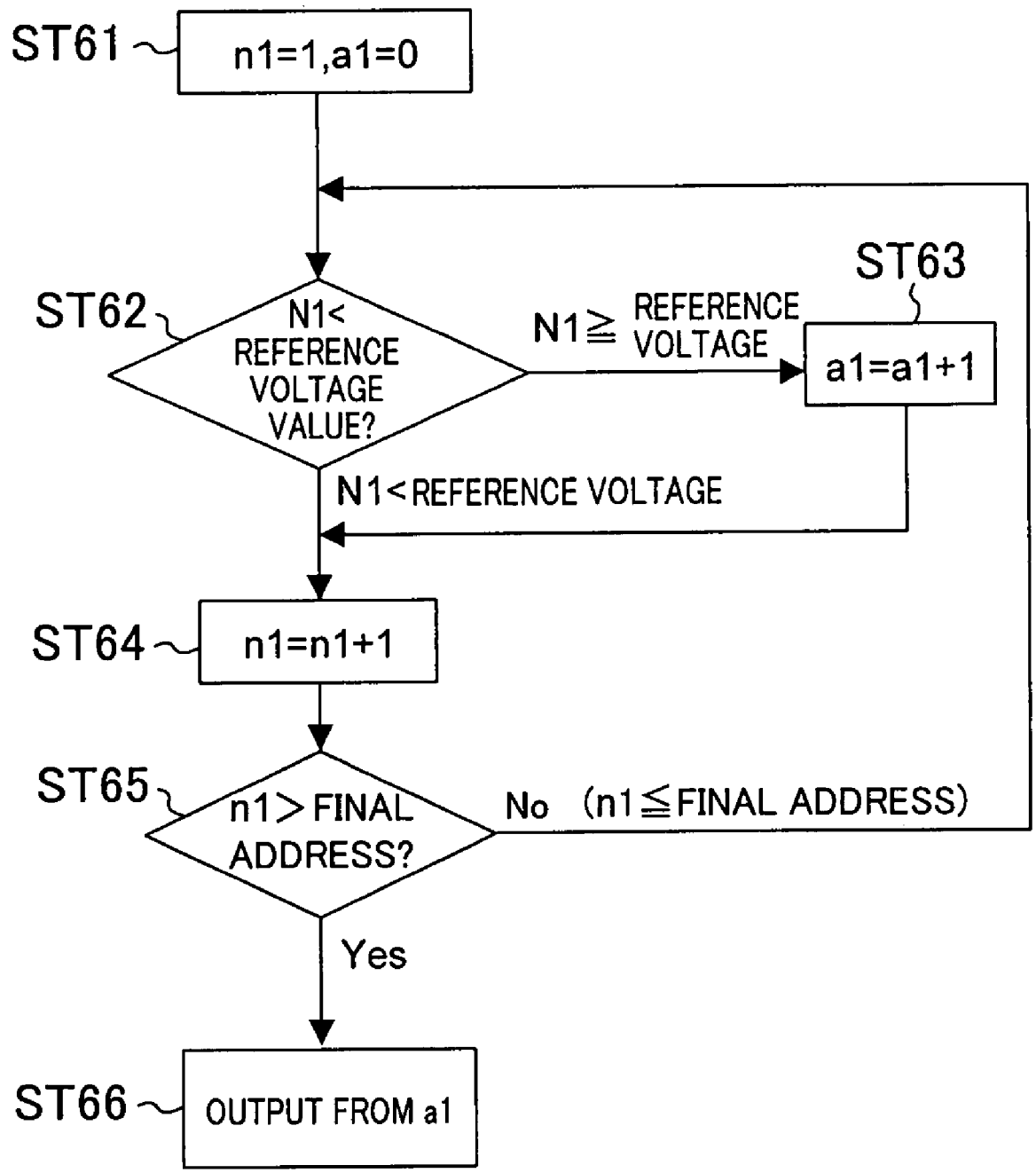
FIG. 14 is a flow chart illustrating comparison processes in a magnitude comparison circuit of Embodiment 5 of the present invention.

FIG. 14 shows an exemplary flow chart of comparison processes in the magnitude comparison circuit 19 of Embodiment 5. In FIG. 14, n1 represents an address of the selected device under test, N1 represents an electrical measured value of the device under test in the address n1, and a1 is a counter which is provided in the counter circuit 70 and which holds the number of devices where the relation N1≧(reference voltage) holds true.

As illustrated with reference to FIG. 14, the address of the device under test is initialized to 1, and the counter a1 is first initialized to 0 in step ST61.

Next, in step ST62, a measured value N1 in the address n1 is compared with the reference voltage in terms of magnitude. If the measured value N1 is greater than or equal to the reference voltage, the counter a1 counts up by one in a next step ST63.

Next, in step ST64, the address n1 is advanced by one address.

In a next step ST65, it is determined whether or not a value of the updated address n1 exceeds a final address value. If it is determined that the value of the updated address n1 does not exceed the final address value, the process is repeated from step ST62.

Upon completion of the series of the repeated processes, the magnitude comparison circuit 19 informs the completion of the comparison processes of the control circuit 20 in a next step ST68. The control circuit 20 outputs a flag signal notifying the completion to the outside 11 via the second control terminal 31. Then, the number of devices held in the counter circuit 70 is output.

As explained above, since in the inspection method of the conventional example, the electrical characteristic of p×q devices under test is measured by the measurement apparatus in the outside, several tens of milliseconds to several hundreds of milliseconds per address are required. Compared to this, since in Embodiment 5, a magnitude comparison between the measured values of devices under test and the reference voltage is made in the semiconductor inspection circuit device, it is possible to realize a comparison time of several hundreds of nanoseconds to several microseconds per comparison at the longest. Therefore, even if 1000 devices under test are fabricated and compared with each other, it is possible to extract a device under test whose electrical measured value is greater or smaller than the reference voltage within several milliseconds. Therefore, in Embodiment 5, times required for extracting a device under test whose measured value is greater than or smaller than the reference voltage can be shorten by three orders of magnitude.

Therefore, it is possible to obtain the number of devices under test whose measured values are greater or smaller than the reference power supply value among, for example, 1000 devices under test in a very short time, which makes it possible to check variation in the fabrication process in a reasonable time.

Here, if, for example, the reference voltage is set as the upper limit or the lower limit of a characteristic specification of a device under test, it is possible to obtain a result of measurement performed on sufficient population parameters within a short time as to probability of distribution of devices incompliant with the specification. Therefore, setting the reference voltage as the upper limit or the lower limit is extremely effective for determining effectiveness of the set specification and variation in the fabrication process.

As mentioned above, according to Embodiment 5, it is possible to inspect enormous numbers of devices in a reasonable time whereas it was practically difficult for the conventional inspection method to measure such enormous numbers of devices.

In Embodiment 5, it has been explained with reference to a case where the devices under test 12a, 12b, 12c, and 12d are two-dimensionally arranged in rows and columns. However, in order to form the devices under test in a scribe line region in the semiconductor wafer 10, it is of course possible to one-dimensionally arrange the devices under test. Note that, the semiconductor inspection circuit device of Embodiment 4 is not necessary to be formed in the scribe line region of the semiconductor wafer 10.

The address control circuit 21 and the magnitude comparison circuit 19 may adopt each variation described in Embodiment 1.

Embodiment 6

Embodiment 6 of the present invention will be explained below with reference to the drawings.

Figure 15A:
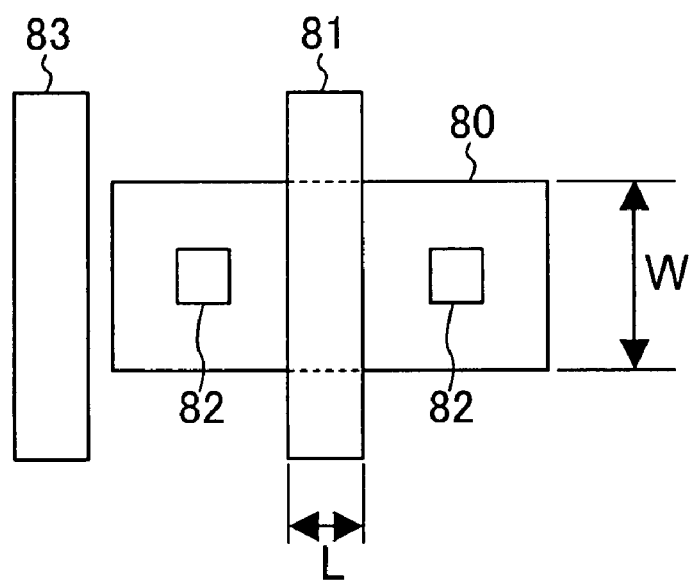
Figure 15B:
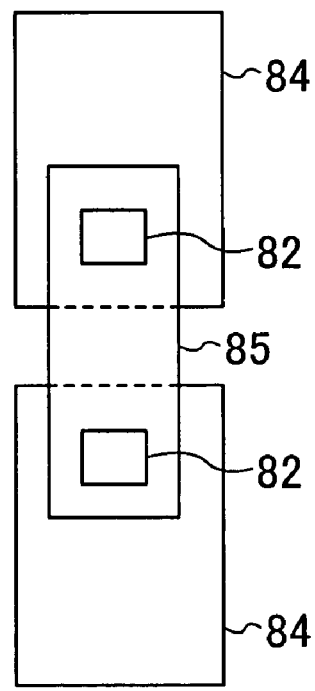

In each of Embodiments 1 through 5 mentioned above, a plurality of devices under test is arranged in rows and columns, each of the devices under test is formed of a transistor shown in FIG. 15A or a contact chain shown in FIG. 15B and has the same shape. In FIG. 15A, the transistor includes: a diffusion layer 80 having a width (gate-width) of W; a gate line 81 formed on the diffusion layer 80 which has a width (gate length) of L; and contacts 82 which are formed on the diffusion layer 80 on both sides of the gate line 81, wherein a dummy gate line 83 extending parallel to the gate line 81 is formed lateral to the diffusion layer 80. In FIG. 15B, the contact chain includes: lower layer lines 84 which is formed at a distance from each other; contacts 82 which is formed on the lower layer lines 84; and an upper layer line 85 which lies above and astride lower layer lines 84 being adjacent to each other and which is connected to each contact 82.

Figure 16A:
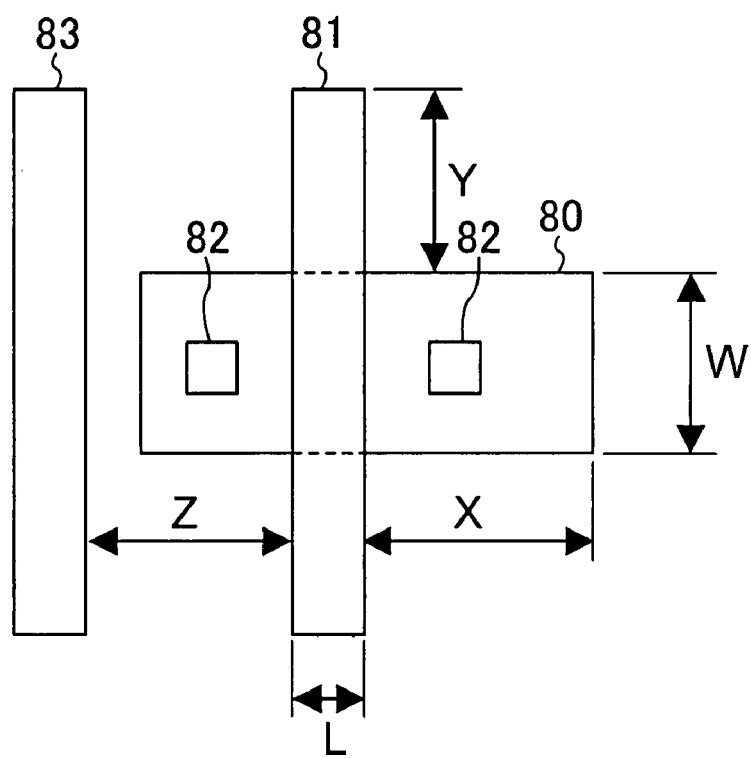

Compared to this, in Embodiment 6, each device under test does not have the same shape, because a transistor shown in FIG. 16A is used to form an array including a plurality of devices under test. In this case, the gate width W and the gate length L of the transistor is fixed, but the transistor varies in shape according to parameters which are dependence of the width X in a gate length direction of the diffusion layer 80, dependence of the length Y of protrusion of the gate line 81 to field (insulation region), and dependence of the distance Z between the gate line 81 and the dummy gate line.

Figure 16B:
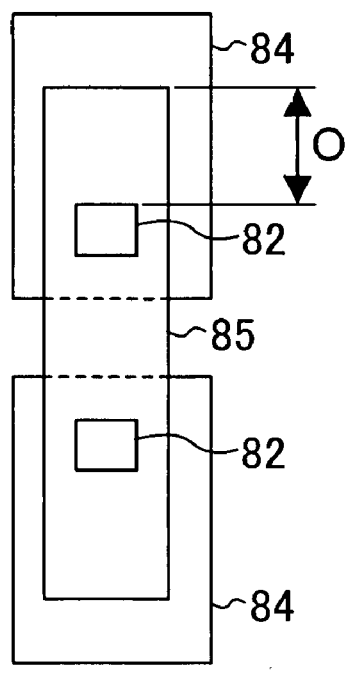

A contact chain shown in FIG. 16B may be used to form an array including a plurality of devices under test. In this case, a shape of the contact chain forming the array varies according to a parameter which is dependence of the distance 0 between one end of the upper layer line 85 and an outer side of the contact 82.

For example, an electrical characteristic of a transistor is basically determined based only on the gate width W and the gate length L. However, as device miniaturized, peripheral shapes based on the parameters X, Y, and Z other than the gate width W and gate length L cause variation in electrical characteristics. This applies also to the contact chain.

Checking the variation in electrical characteristics, including each of the parameters W, L, X, Y, and Z, or the parameter O, also becomes a more and more important factor to miniaturize the device, that is, to determine a layout rule.

As described above, in Embodiment 6, evaluating transistor array considering each parameter makes it possible to check a degree of influence (dependence) of each parameter on the transistor characteristics, so that an important parameter of the layout rule to miniaturize the device can be obtained.

As described above, according to the semiconductor integrated circuit device and inspection method therefor of the present invention, it is possible to verify the fabrication process within a short time. Therefore, it possible to find a decrease in yield at an early stage, the decrease being caused by variation in fabrication process. Therefore, the present invention is applicable to an inspection circuit for controlling fabrication steps of a semiconductor integrated circuit device, to a semiconductor integrated circuit device for evaluating and controlling fabrication processes and for analyzing a defect using the inspection circuit, and to an inspection method therefor.

What is claimed is:

1. A semiconductor integrated circuit device comprising:
a plurality of devices under test formed on a substrate;
a selection circuit formed on the substrate which selects two of the plurality of devices under test;
a magnitude comparison circuit formed on the substrate which measures an electrical characteristic of the two selected devices under test and makes a magnitude comparison between values of the measured electrical characteristic;
an address memory circuit formed on the substrate which stores addresses of the two devices under test between which the magnitude comparison has been made; and
a control circuit formed on the substrate and connected to the selection circuit, the magnitude comparison circuit, and the address memory circuit.

2. The semiconductor integrated circuit device of claim 1, wherein the control circuit has a first operation mode in which the control circuit performs the following processes:
enabling the magnitude comparison circuit to successively measure the electrical characteristic of the two devices under test selected by the selection circuit;
extracting at least one of a first device under test and a second device under test, the first device under test having the maximum value and the second device under test having the minimum value among measured values of the plurality of devices under test; and
storing an address of at least one of the extracted first and second devices under test in the address memory circuit.

3. The semiconductor integrated circuit device of claim 2, wherein the control circuit has a second operation mode in which the control circuit outputs to an external terminal the electrical characteristic of at least one of the first device under test and the second device under test extracted in the first operation mode.

4. The semiconductor integrated circuit device of claim 3, wherein
in the first operation mode, the control circuit performs at least one of the following processes
extracting a predetermined number of devices under test in descending order of the measured values such that the extracted devices include the first device under test, and
extracting a predetermined number of devices under test in ascending order of the measured values such that the extracted devices include the second device under test, and
in the second operation mode, the control circuit outputs to the external terminal the electrical characteristic of at least one group of the predetermined number of devices under test extracted in descending order of the measured values which includes the first device under test and the predetermined number of devices under test extracted in ascending order of the measured values which includes the second device under test.

5. The semiconductor integrated circuit device of claim 4, wherein
in the first operation mode, the control circuit excludes from the plurality of devices under test such devices under test that are determined to be the predetermined number of devices under test extracted from the measured devices under test in descending order of the measured values which includes the first device under test, or the predetermined number of devices under test extracted from the measured devices under test in ascending order of the measured values which includes the second device under test.

6. The semiconductor integrated circuit device of claim 1, wherein the magnitude comparison circuit includes a current mirror circuit whose sources are respectively connected to the two of the plurality of devices under test, and a difference in current drivability between the two devices under test is output to the current mirror circuit.

7. The semiconductor integrated circuit device of claim 1, wherein the magnitude comparison circuit includes a sense amplifier circuit formed on the substrate with which a difference in time required for discharging an electric charge charged in stray capacitances of bus lines is detected as a potential difference, the bus lines connecting the magnitude comparison circuit with the plurality of devices under test and the discharging being caused by a current flowing through the selected devices under test.

8. The semiconductor integrated circuit device of claim 1, further comprising an address output circuit to which an address of any of the plurality of devises under test is externally input to specify an address and which outputs to the external terminal the electrical characteristic of a device under test corresponding to the specified address.

9. The semiconductor integrated circuit device of claim 1, wherein the plurality of devices under test are arranged in rows and columns, and the selection circuit is connected to column selection lines and row selection lines.

10. The semiconductor integrated circuit device of claim 1, wherein the plurality of devices under test include devices under test which are different in plane dimensions from each other.

11. The semiconductor integrated circuit device of claim 1, wherein the substrate is a semiconductor wafer, and at least the plurality of devices under test, the selection circuit, the address memory circuit, and the control circuit are formed in a scribe line region which is provided between chip formation regions on the semiconductor wafer.

12. A semiconductor integrated circuit device comprising:
a plurality of devices under test formed on a substrate;
a selection circuit formed on the substrate which selects two of the plurality of devices under test;
a magnitude comparison circuit formed on the substrate which measures an electrical characteristic of the two selected devices under test and makes a magnitude comparison between values of the measured electrical characteristic;
an address memory circuit formed on the substrate which stores addresses of the two devices under test between which the magnitude comparison has been made;
a counter circuit formed on the substrate which counts one of the two devices under test and holds the counted number, the magnitude comparison having been made between the two devices under test;
a control circuit formed on the substrate and connected to the selection circuit, the magnitude comparison circuit, and the address memory circuit.

13. The semiconductor integrated circuit device of claim 12, wherein the control circuit has a first operation mode in which
the control circuit enables the magnitude comparison circuit to measure the electrical characteristic of a device under test first selected by the selection circuit and one of the other devices under test excepting the first selected device under test,
the number of devices under test having greater or smaller values of the electrical characteristic than the first selected device under test is held in the counter circuit, and
the magnitude comparison is repeated while successively updating the first selected device under test until the number held in the counter circuit reaches about one half of the number of the plurality of devices under test at completion of the magnitude comparison performed on all the plurality of devices under test such that a device under test having a median or a value close to the median among measured values of the electrical characteristic is extracted from the plurality of devices under test.

14. The semiconductor integrated circuit device of claim 13, wherein the control circuit has a second operation mode in which the control circuit outputs to an external terminal the electrical characteristic of the device under test selected in the first operation mode.

15. The semiconductor integrated circuit device of claim 12, wherein the magnitude comparison circuit includes a current mirror circuit whose sources are respectively connected to the two of the plurality of devices under test, and a difference in current drivability between the two devices under test is output to the current mirror circuit.

16. The semiconductor integrated circuit device of claim 12, wherein the magnitude comparison circuit includes a sense amplifier circuit formed on the substrate with which a difference in time required for discharging an electric charge charged in stray capacitances of bus lines is detected as a potential difference, the bus lines connecting the magnitude comparison circuit with the plurality of devices under test and the discharging being caused by a current flowing through the selected devices under test.

17. The semiconductor integrated circuit device of claim 12, wherein the devices under test are arranged in rows and columns, and the selection circuit is connected to column selection lines and row selection lines.

18. The semiconductor integrated circuit device of claim 12, wherein the plurality of devices under test include devices under test which are different in plane dimensions from each other.

19. The semiconductor integrated circuit device of claim 12, wherein the substrate is a semiconductor wafer, and at least the plurality of devices under test, the selection circuit, the address memory circuit, and the control circuit are formed in a scribe line region which is provided between chip formation regions on the semiconductor wafer.

20. A semiconductor integrated circuit device comprising:
a plurality of devices under test formed on a substrate;
a reference power supply generation circuit formed on the substrate which generates a reference voltage;
a selection circuit formed on the substrate which selects one of the plurality of devices under test;
a magnitude comparison circuit formed on the substrate which measures an electrical characteristic of the selected device under test and makes a magnitude comparison between a value of the measured electrical characteristic and the reference voltage;
a counter circuit formed on the substrate which enables the magnitude comparison circuit to measure the electrical characteristic of the device under test successively selected by the selection circuit from the plurality of devices under test, and counts the number of devices under test having greater or smaller values of the electrical characteristic than the reference voltage and holds the counted number; and
a control circuit formed on the substrate and connected to the selection circuit, the magnitude comparison circuit, and the address memory circuit.

21. The semiconductor integrated circuit device of claim 20, wherein the control circuit has an operation mode in which
the control circuit enables the magnitude comparison circuit to measure the electrical characteristic of the device under test successively selected by the selection circuit from the plurality of devices under test,
the number of devices under test having greater or smaller values of the electrical characteristic than the reference voltage is held in the counter circuit, and
on completion of the magnitude comparison performed on all the plurality of devices under test, the control circuit outputs to an external terminal the number of the devices under test held in the counter circuit.

22. The semiconductor integrated circuit device of claim 20, wherein the magnitude comparison circuit includes a current mirror circuit whose sources are respectively connected to the selected device under test and the reference power supply generation circuit, and a difference in current drivability between the selected device under test and the reference power supply generation circuit is output to the current mirror circuit.

23. The semiconductor integrated circuit device of claim 20, wherein the magnitude comparison circuit includes a sense amplifier circuit formed on the substrate with which a difference in time required for discharging an electric charge charged in stray capacitances of bus lines is detected as a potential difference, the bus lines connecting the magnitude comparison circuit with the plurality of devices under test and the discharging being caused by a current flowing through the selected device under test and the reference power supply generation circuit.

24. The semiconductor integrated circuit device of claim 20, wherein the plurality of devices under test are arranged in rows and columns, and the selection circuit is connected to column selection lines and row selection lines.

25. The semiconductor integrated circuit device of claim 20, wherein the plurality of devices under test include devices under test which are different in plane dimensions from each other.

26. The semiconductor integrated circuit device of claim 20, wherein the substrate is a semiconductor wafer, and at least the devices under test, the selection circuit, the address memory circuit, and the control circuit are formed in a scribe line region which is provided between chip formation regions on the semiconductor wafer.

27. An inspection method for a semiconductor integrated circuit device, comprising the steps of:
   (a) selecting two of a plurality of devices under test formed on a substrate;
   (b) measuring an electrical characteristic of the two selected devices under test and making a magnitude comparison between values of the measured electrical characteristic to extract the device under test having a greater measured value and the device under test having a smaller measured value;
   (c) performing step (a) and step (b) repeatedly until completion of the measurement of the electrical characteristic of all the plurality of devices under test and extracting a first device under test and a second device under test from the plurality of devices under test, the first device under test having the maximum value and the second device under test having the minimum value among measured values of the electrical characteristic;
   (d) evaluating the electrical characteristic of the first device under test and the second device under test extracted in step (c) using an external electrical characteristic evaluation apparatus.

28. The inspection method of claim 27, wherein
   step (c) includes extracting a predetermined number of devices under test in descending order of the measured values such that the extracted devices include the first device under test and extracting a predetermined number of devices under test in ascending order of the measured values such that the extracted devices include the second device under test, and
   step (d) includes respectively evaluating the electrical characteristic of the predetermined number of devices under test extracted in descending order of the measured values which includes the first device under test and the electrical characteristic of the predetermined number of devices under test extracted in ascending order of the measured values which includes the second device under test.

29. The inspection method of claim 28, wherein step (c) includes excluding from the devices under test such devices under test that are determined to be the predetermined number of devices under test extracted from the measured devices under test in descending order of the measured values which includes the first device under test and the predetermined number of devices under test extracted from the measured devices under test in ascending order of the measured values which includes the second device under test.

30. An inspection method for a semiconductor integrated circuit device, comprising the steps of:
   (a) from a plurality of devices under test formed on a substrate, first selecting a device under test and then selecting one of the other devices under test excepting the first selected device under test;
   (b) measuring an electrical characteristic of the two selected devices under test and making a magnitude comparison between values of the measured electrical characteristic to extract the device under test having a greater measured value or the device under test having a smaller measured value;
   (c) counting the extracted device under test and holding the counted number;
   (d) performing step (b) and step (c) on every one of the rest of the other devices under test and repeating the magnitude comparison while successively updating the first selected device under test until the counted number in step (c) reaches about one half of the number of the plurality of devices under test at completion of the magnitude comparison performed on all the plurality of devices under test such that a device under test having a median or a value close to the median among measured values of the electrical characteristic is extracted from the plurality of devices under test; and
   (e) evaluating the electrical characteristic of the device under test extracted in step (d) using an external electrical characteristic evaluation apparatus.

31. An inspection method for a semiconductor integrated circuit device comprising the steps of:
   (a) selecting one of a plurality of devices under test formed on a substrate;
   (b) measuring an electrical characteristic of the selected device under test and making a magnitude comparison between a value of the measured electrical characteristic and a reference voltage to extract the device under test having a greater or smaller value of electrical characteristic than the reference voltage;
   (c) counting the extracted device under test and holding the counted number; and
   (d) performing step (b) and step (c) on every one of the rest of the other devices under test and outputting the counted number in step (c) to the outside at the time of completion of the magnitude comparison of all the plurality of devices under test.

* * * * *